(12) United States Patent
Tunayama et al.

(10) Patent No.: US 6,757,143 B2
(45) Date of Patent: Jun. 29, 2004

(54) MAGNETORESISTIVE EFFECT ELEMENT, ITS MANUFACTURING METHOD, MAGNETIC HEAD, MAGNETIC REPRODUCING APPARATUS, AND MAGNETIC MEMORY

(75) Inventors: Tomomi Tunayama, Kanagawa-ken (JP); Masayuki Takagishi, Kanagawa-ken (JP); Kohichi Tateyama, Kanagawa-ken (JP); Yuichi Ohsawa, Kanagawa-ken (JP); Susumu Hashimoto, Kanagawa-ken (JP); Michiko Hara, Kanagawa-ken (JP); Akio Hori, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 10/105,342

(22) Filed: Mar. 26, 2002

(65) Prior Publication Data

US 2002/0135948 A1 Sep. 26, 2002

(30) Foreign Application Priority Data

Mar. 26, 2001 (JP) ........................................ 2001-088448

(51) Int. Cl.[7] .............................................. G11B 5/127
(52) U.S. Cl. ................................................... 360/324.1
(58) Field of Search ............................. 360/324.1, 322, 360/324.11, 324.12, 327.2, 327.23, 324.2

(56) References Cited

U.S. PATENT DOCUMENTS

| | | | |
|---|---|---|---|
| 5,438,470 A | | 8/1995 | Ravipati et al. |
| 5,668,688 A | | 9/1997 | Dykes et al. |
| 5,731,937 A | | 3/1998 | Yuan |
| 6,504,690 B2 | * | 1/2003 | Komuro et al. .......... 360/324.2 |
| 6,542,340 B1 | * | 4/2003 | Hayashi ...................... 360/322 |
| 6,587,315 B1 | * | 7/2003 | Aoki et al. .................. 360/322 |
| 6,587,318 B2 | * | 7/2003 | Komuro et al. .......... 360/342.2 |

* cited by examiner

*Primary Examiner*—Allen Cao

(57) ABSTRACT

In a magnetoresistive effect element, at least one of electrodes for supplying a current perpendicularly to the film plane of a magnetoresistive effect film is narrower than the distance between bias-applying films. The sensitivity of the magnetoresistive effect film is lower in regions thereof near the bias-applying films due to an intensive bias magnetic field from the bias-applying films. However, the electrodes are disposed in an inner region having a high sensitivity avoiding those regions with a lower sensitivity to ensure a high sensitivity. The electrodes disposed on and under the magnetoresistive effect film are pillar-shaped to concentrate the sense current such that the sense current can be concentrically supplied exclusively to the region with the high sensitivity.

19 Claims, 28 Drawing Sheets

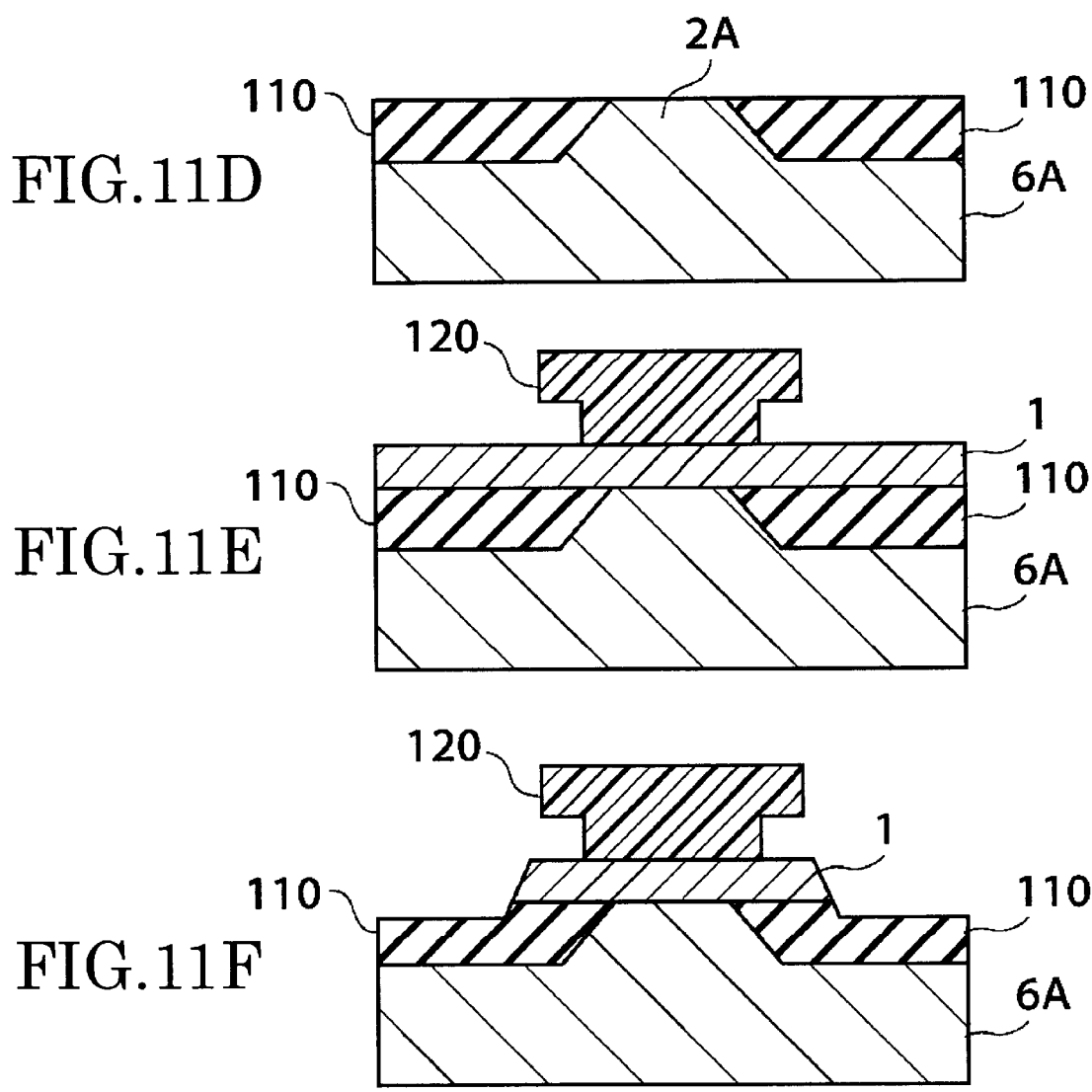

MAGNETORESISTIVE EFFECT ELEMENT, ITS MANUFACTURING METHOD, MAGNETIC HEAD, MAGNETIC REPRODUCING APPARATUS, AND MAGNETIC MEMORY

CROSS-REFERENCE TO RELATED APPLICATIONS

This application is based upon and claims the benefit of priority from the prior Japanese Patent Application No. 2001-088448, filed on Mar. 26, 2001; the entire contents of which are incorporated herein by reference.

BACKGROUND OF THE INVENTION

This invention relates to a magnetoresistive effect element, its manufacturing method, magnetic head, magnetic reproducing apparatus and magnetic memory, and more particularly, to a magnetoresistive effect element having a structure for carrying a sense current perpendicularly to the film plane thereof and applying a bias magnetic field to enable more sensitive detection than conventional elements of this kind, its manufacturing method, a magnetic head using the element, a magnetic reproducing apparatus using the magnetic head, and a magnetic memory using the magnetoresistive effect elements.

Magnetic reproducing devices such as hard disk devices have rapidly moved toward downsizing and high densities, and are still expected to become higher in density. For realizing higher densities in magnetic recording technologies, it is necessary to increase the lengthwise recording density, i.e. line recording density, in addition to increasing the recording track density by narrowing the recording track width.

However, in the "lengthwise recording method" that magnetizes a medium in its lengthwise direction, as the recording density increases, the demagnetizing field increases, and it results in decreasing the reproduction output and disabling stable recording. To alleviate these problems, "perpendicular magnetic recording" has been proposed. Perpendicular magnetic recording is a method of magnetizing a recording medium perpendicularly to its plane for recording, and has the advantage of less adverse influences of demagnetization even under a high recording density than the lengthwise recording and a less decrease of the reproduction output.

For reproduction of signals from mediums, either in the lengthwise recording or in the perpendicular recording, magnetic induction heads have been used conventionally. However, along with progressive increases of the recording density, the recording track width becomes narrower, and the intensity of recorded magnetization becomes weaker. Taking it into account, toward obtaining a sufficient reproduction output by detecting such weak magnetization, an AMR (anisotropic magnetoresistive effect) head using anisotropic magnetoresistive effect and having a high reproduction sensitivity has been developed and brought into practical use as a shield type reproducing head. Additionally, a spin valve GMR (giant magnetoresistive effect) head using GMR effect and having a higher sensitivity has recently come to be used, and magnetic heads using TMR (tunneling magnetoresistive) effect are also under researches toward development and practical use.

By development and employment of these magnetic heads, a clue to reproduction of recording signals was found even with very small recording bit sizes.

As the recording density increases, the sensitivity of the sensor must be higher. CPP (current perpendicular to the plane) type GMR elements meet such requirement. This is an element of the type supplying the GMR film having a multi-layered thin film structure with a sense current for detection of a magnetic field to the perpendicularly to the film plane.

CPP elements are disclosed in, for example, Japanese Patent Laid-Open Publication No. H10-55512 and U.S. Pat. No. 5,668,688.

On the other hand, there is a method that, for the purpose of suppressing the Barkhausen noise, places bias films at opposite ends and applies a bias magnetic field from the bias films. The Inventors, however, have found that narrowing the distance between the bias-applying films along with progressive decrease of the track width for the purpose of increasing the recording density results in applying an excessively high bias magnetic field and in decreasing the sensitivity of the element.

Neither Japanese Patent Laid-Open Publication No. H10-55512 nor U.S. Pat. No. 5,668,688 mentioned above suggests that problem, and it is difficult for the configurations disclosed therein to sufficiently overcome the problem.

On the other hand, for realizing highly sensitive CPP type GMR elements, the sense current has to flow as perpendicular as possible to the film plane. However, since these highly sensitive MR elements are usually made of a multi-layered film different in resistance, the current profile changes depending on the combination of the layers including the base layer, protective layer and electrode layer, and results in fluctuation of the output. Therefore, control of the current profile is very important.

Additionally, in case of flowing the sense current perpendicularly to the film plane, a magnetic field caused by the sense current is added concentrically around the current center. This magnetic field caused by the sense current is most intensive at an end of the electrode supplying the sense current, and saturates the magnetic shield near there. There occurs the problem that the effective shield distance increases.

BRIEF SUMMARY OF THE INVENTION

It is therefore an object of the invention to provide a CPP type magnetoresistive effect element having bias-applying films and enabling high-density, high-sensitivity magnetic detection, and its manufacturing method, and to provide a magnetic head, magnetic reproducing device and magnetic memory such as MRAM, which use the magnetoresistive effect element.

To accomplish the object, a magnetoresistive effect element according to an embodiment of the invention comprises:

a magnetoresistive effect film having first and second main surfaces opposed to each other;

a first electrode having a first contact surface in contact with the first main surface of the magnetoresistive effect film by a first width;

a second electrode having a second contact surface in contact with the second main surface of the magnetoresistive effect film so as to be opposed to the first electrode; and a pair of bias-applying films spaced apart by a distance wider than the first width of the first contact surface in the direction of the first width to apply a bias magnetic field in a direction substantially in parallel to the film main surfaces of the magnetoresistive effect film.

As explained above, according to the embodiments of the invention, a high sensitivity can be realized in a CPP type magnetoresistive effect element even under a high recording density by supplying the sense current exclusively to the inner portion having a high sensitivity, avoiding portions near the bias-applying films where the sensitivity is lowered by the intensive bias magnetic field.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIGS. 8A and 8B are rough diagrams for explaining effects of a high-resistance layer 5, in which FIG. 8A is a cross-sectional view schematically showing the profile of the sense current in a configuration without the high-resistance layer 5, and FIG. 8B is that in a configuration including the high-resistance layer 5;

FIGS. 11A through 11F are cross-sectional views of a magnetic head according to an embodiment of the invention under a manufacturing process of its significant part;

FIGS. 15A through 15F are cross-sectional views schematically showing how side etching occurs and progresses under a mask 100;

DETAILED DESCRIPTION OF THE INVENTION

Embodiments of the invention will now be explained in detail with reference to the drawings.

Figure 1:
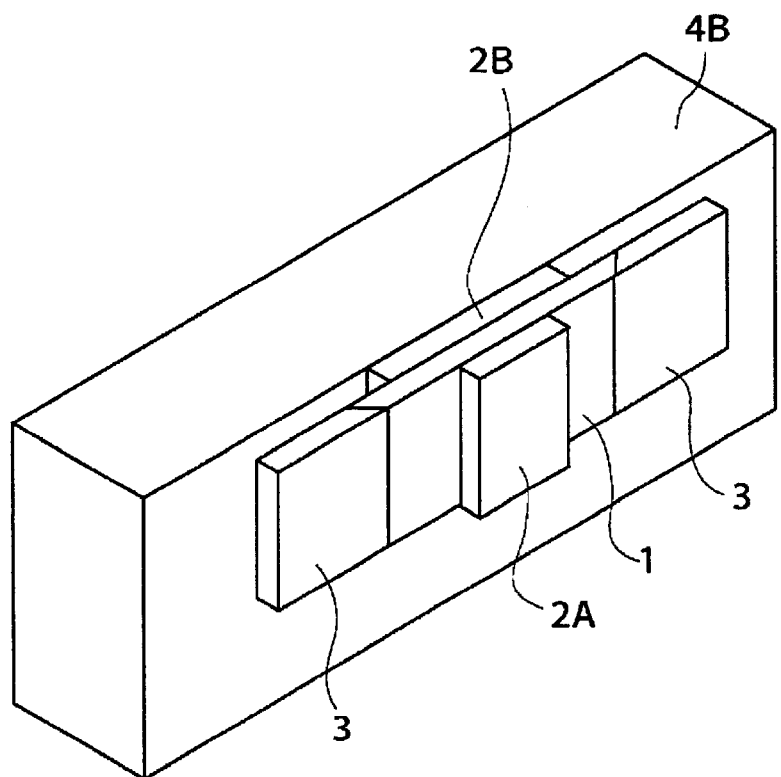
FIG. 1 is a perspective view schematically showing a configuration of the significant part of a magnetic head having a CPP type magnetoresistive effect element according to the first embodiment of the invention.

FIG. 1 is a perspective view schematically showing a configuration of the significant part of a magnetic head having a CPP type magnetoresistive effect element according to the first embodiment of the invention. In this figure, a medium-facing surface facing to a recording medium (not shown) appears at the top.

Figure 2:
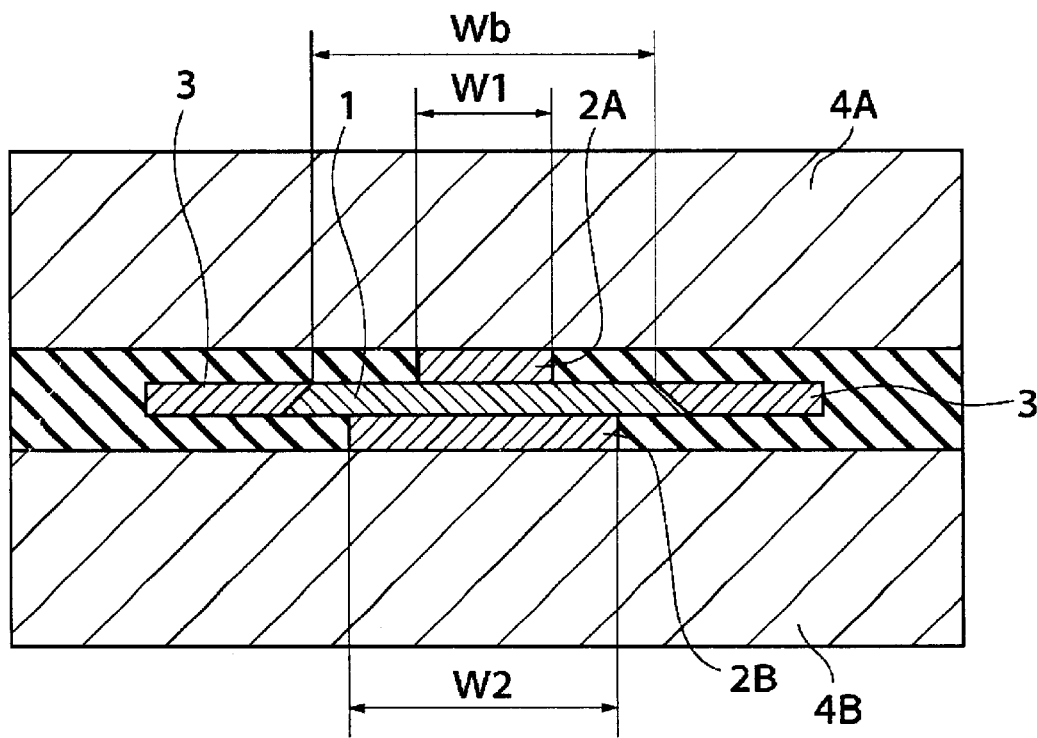
FIG. 2 is a cross-sectional view of the magnetic head according to the first embodiment of the invention.

FIG. 2 is a cross-sectional view of the magnetic head according to the first embodiment. In this figure, the medium-facing surface is in this side of the plane of the drawing sheet.

On and under the film surfaces of a magnetoresistive effect film 1, electrodes 2A, 2B of Cu (copper) or other material are formed. These electrodes 2A, 2B have the role of carrying a sense current to the magnetoresistive effect film 1. At opposite sides of the magnetoresistive effect film 1, bias-applying films 3 of CoPt (cobalt platinum) or other material are formed. The bias-applying films 3 have the role of applying a bias magnetic field of the magnetoresistive effect film to reduce the Barkhausen noise.

The magnetoresistive effect element having these components is sandwiched between a pair of magnetic shields 4A, 4B to make up the significant part of the magnetic head. FIG. 1 shows the magnetic head, removing the magnetic shield 4A from this side thereof as shown.

In the embodiments of the present invention, the magnetoresistive effect film 1 may be a CPP type GMR film. The bias-applying films 3 may be hard magnetic films of CoPt or other material, or antiferromagnetic films of PtMn, IrMn or other material. The bias-applying films 3 may be disposed to lie adjacent to the magnetic film, to underlie or overlie the magnetoresistive effect film 1, or to overlap. These methods for selective placement of component films or layers can be appropriately selected in combination with the desired magnetic property and thickness of the bias-applying films to ensure an optimum bias magnetic field to be applied to the magnetoresistive effect film 1.

The electrodes 2A, 2B may be made of a conductive film of Cu, for example. Alternatively, a part of the magnetic resistance film 1 other than the free layer, namely, protective film ferromagnetic film or pinned layer, for example, may be used as the electrodes.

In the CPP type magnetoresistive effect element having the above-summarized configuration, the sensitivity in the magnetoresistive effect film 1 is locally lowered near the bias-applying films 3 by the strong bias magnetic field therefrom. However, since the electrodes are located only at inner portions with a high sensitivity, avoiding the portions adjacent to the bias-applying films, a high sensitivity can be realized.

The "contact surfaces" between the electrodes and the magnetoresistive effect film contemplate the planes of electrical contact between the electrodes 2A, 2B and the magnetoresistive effect film 1. A current flows via the contact surface from the electrodes into the magnetoresistive effect film, or from the magnetoresistive effect film into the electrodes. However, if, for example, a high-resistance layer is interposed between the electrodes and the magnetic resistance film, the "contact surfaces" mean the portions where the electrodes and the high-resistance layer electrically contact.

The "width" of each contact surface is defined to be the length of the contact surface measured along the direction of locations of the pair of bias-applying films 3.

When the width first width is W1 and the width of the contact surface between the second electrode and the magnetoresistive effect film is W2, the widths may be in the relation of W1<W2.

In the CPP type magnetoresistive effect element according to an embodiment of the invention, the electrodes disposed on and under the magnetoresistive effect film may be pillar-shaped to confine the sense current for the purpose of flowing the sense current exclusively to the portions with a high sensitivity.

It is, however, difficult to accurately align the upper and lower electrodes without any error. To alleviate adverse influences of such a positional error, one of the electrodes may be wider than the other. However, if the wider electrode is excessively wide, the sense current diffuses too wide. Therefore, the width of the wider electrode is preferably within the distance between the bias-applying films 3.

The magnetoresistive effect film 1 may include a magnetically free layer, magnetically pinned layer and conductive non-magnetic intermediate layer interposed between the magnetically free layer and the magnetically pinned layer.

That is, in an embodiment of the invention, when a GMR film is used as the magnetoresistive effect film, the current profile in that film can be controlled best, and an especially remarkable effect is obtained.

In case the first width W1 is 0.3 micron or less, the embodiment of the invention is especially effective. That is, although the conventional magnetoresistive effect elements is disadvantageous for increasing the sensitivity for the above-discussed various reasons when narrowing the track width to cope with higher densities, the embodiment of the invention can remarkably improve the sensitivity as compared with conventional elements when the distance between the bias-applying films is 0.3 micron or less.

The magnetoresistive effect element may include a high-resistance layer made of a material having a higher specific resistance than that of the electrodes and interposed between the first or second electrode and the magnetoresistive effect film.

More specifically, in the CPP type magnetoresistive effect element according an embodiment of the invention, the electrodes pillar-shaped and disposed on and under the magnetoresistive effect film can confine the sense current and can guide the sense current exclusively to the portions having a higher sensitivity. Additionally, by interposing the layer having a higher resistance than the electrode between at least one of the electrodes and the magnetoresistive effect film, spreading of the current profile can be prevented.

The lengthwise direction of the contact surface between one of the first and second electrodes and the magnetoresistive effect film may be twisted by approximately 90 degrees from the lengthwise direction of the contact surface between the other electrode and the magnetoresistive effect film.

For example, the contact surfaces between the electrodes and the magnetoresistive effect film may be approximately rectangular or oval, and by orienting their lengthwise directions, i.e. their long side or major axes in different directions from each other by 90 degrees the overlapping area of the upper and lower electrodes can be kept constant even when they fail to align. As a result, production variance of the element can be alleviated.

The magnetoresistive effect element may further include a pair of magnetic shields formed to sandwich the magnetoresistive effect film.

The CPP type magnetoresistive effect element having the above-summarized configuration is effective for making a shield type magnetic head, when it is used in combination with a pair of magnetic shields formed to sandwich it.

The magnetoresistive effect element may further includes a current-carrying layer interposed between one of the magnetic shields and the magnetoresistive effect film and made of a material having a lower specific resistance than the magnetic shield, and the current-carrying layer may be electrically connected to one of the first and second electrodes.

That is, the use of the current-carrying layer disposed inside the magnetic shield and lower in specific resistance than the magnetic shield for carrying the current to the electrode is effective for preventing that the magnetic shield saturates near the electrode by influences of the magnetic field caused by a current flowing into the magnetoresistive effect film.

The magnetoresistive effect element may further include first and second wirings connected to the first and second electrodes, respectively. The first and second wirings may extend substantially in parallel to the medium-facing surface within the range where the magnetic field produced by the current flowing in the wirings substantially reaches the magnetoresistive effect film, and may extend in substantially the same direction.

That is, when the current-carrying path for carrying the current through the electrode to the magnetoresistive effect film extends substantially in parallel to the medium-facing surface near the electrode such that the sense current is supplied from left to right, from right to left, or symmetrically from right and left sides, when viewed from the medium-facing surface, adverse influences of the magnetic field caused by the sense current to the magnetoresistive effect film can be reduced, and the sensitivity is improved.

Any of the magnetoresistive effect elements summarized above can be used as the substantial part of a reproducing magnetic head to realize the shield type magnetic head indicated above, or a yoke type head when used in combination with a magnetic yoke introducing a signal magnetic flux.

By using such a magnetic head, it is possible to realize a magnetic reproducing apparatus with a high recording density, which can reproduce information magnetically recorded on a magnetic recording medium.

A magnetic memory device comprising a plurality of magnetoresistive effect elements having one of the above-summarized configurations is useful as magnetically erasable and programmable MRAM (magnetic random access memory)

The magnetoresistive effect film 1 may be a GMR film.

Figure 3:
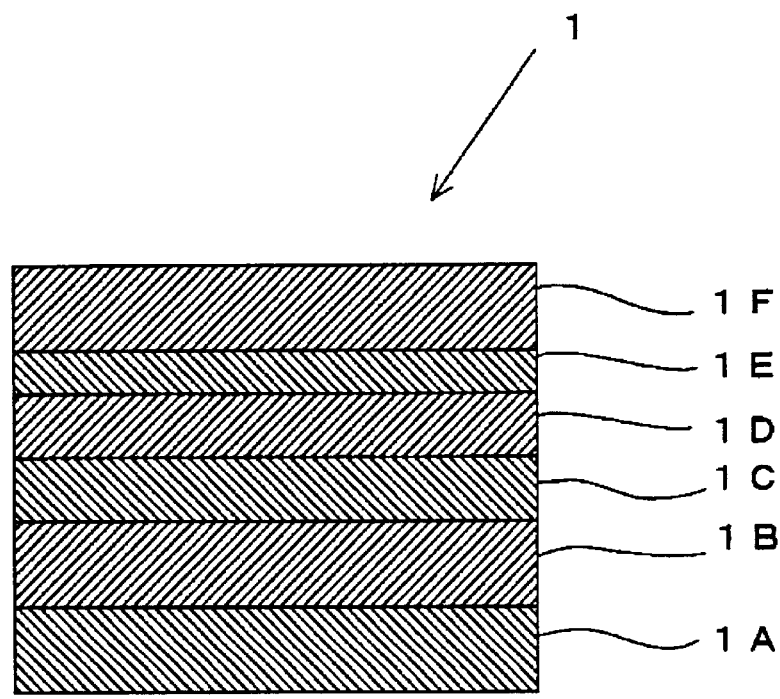
FIG. 3 is a cross-sectional view schematically showing the basic configuration of a GMR film.

FIG. 3 is a cross-sectional view schematically showing the basic configuration of a GMR film. The GMR film 1 includes, for example, a base layer 1A, antiferromagnetic layer 1B, magnetically pinned layer (pinned layer) 1C, non-magnetic intermediate layer 1D, magnetically free layer (free layer) 1E, and protective layer 1F that are laminated in this order.

Material of the base layer 1A may be Ta (tantalum).

Material of the antiferromagnetic layer 1B may be, for example, PtMn (platinum manganese).

The magnetically pinned layer 1C may be a three-layered film of CoFe (cobalt iron) on Ru (ruthenium) on CoFe (cobalt iron).

Material of the non-magnetic intermediate layer 1D may be, for example, Cu.

The magnetically free layer 1E may be a two-layered film of CoFe on NiFe (nickel-iron).

Material of the protective film 1F may be, for example, Ta.

However, structure of the magnetoresistive effect film 1 is not limited to that shown in FIG. 3, but any of various structures including the structure having the same layers inverted in order of lamination, so-called "synthetic" structure employing an artificial lattice and so-called "dual" structure having two magnetically pinned layers symmetrically disposed in upper and lower layers may be similarly used.

Referring back to FIGS. 1 and 2, one of features of the instant embodiment lies in satisfying the following relationship among the distance Wb between the bias-applying films 3, 3, width W1 of the contact surface between the electrode 2A and the magnetoresistive effect film 1, and width W2 of the contact surface between the electrode 2B and the magnetoresistive effect film 1.

$$W1<W2<Wb \quad (1)$$

In this specification, the "width of the contact surface" between the electrode 2A and the magnetoresistive effect film 1 is the width of the contact surface of the electrode 2A in electrical contact with the magnetoresistive effect film 1, and it is defined as the length in the direction of alignment of the pair of bias-applying films 3, 3 as shown in FIG. 2. The same definition is used also for the electrode 2B.

When the respective layers are formed to satisfy the relation (1), not only possible is introduction of the sense current only to a central part of the magnetoresistive effect film 1, but also substantially unchanged is the current profile even under a positional error around tens of nanometers between the upper and lower electrodes. Therefore, magnetoresistive effect elements reduced in output fluctuation can be obtained.

Explanation is made below about some reasons thereof.

The embodiments of the invention can improve the output relative to the sense current by controlling the width W1 of the electrode 2A narrower than the distance Wb between the bias applying films 3, 3 and applying the sense current only to a central part of the magnetoresistive effect film 1. Its reason lies in that, when the bias-applying films 3 are formed at opposite ends of the magnetoresistive effect film 1, sensitivity of the magnetoresistive effect film 1 locally decreases in parts thereof near the bias-applying films 3 due to application of an intensive bias magnetic field, and it is highest in a central part thereof remote from the bias-applying films 3 at opposite ends. Since the embodiments of the invention does not apply the sense current to the parts of the magnetoresistive effect film close to the bias-applying films 3, these parts do not function as sensing areas. By selectively introducing the sense current exclusively to the central part of the magnetoresistive effect film 1 having a high sensitivity, the embodiments of the invention can improve the output.

Figure 4:
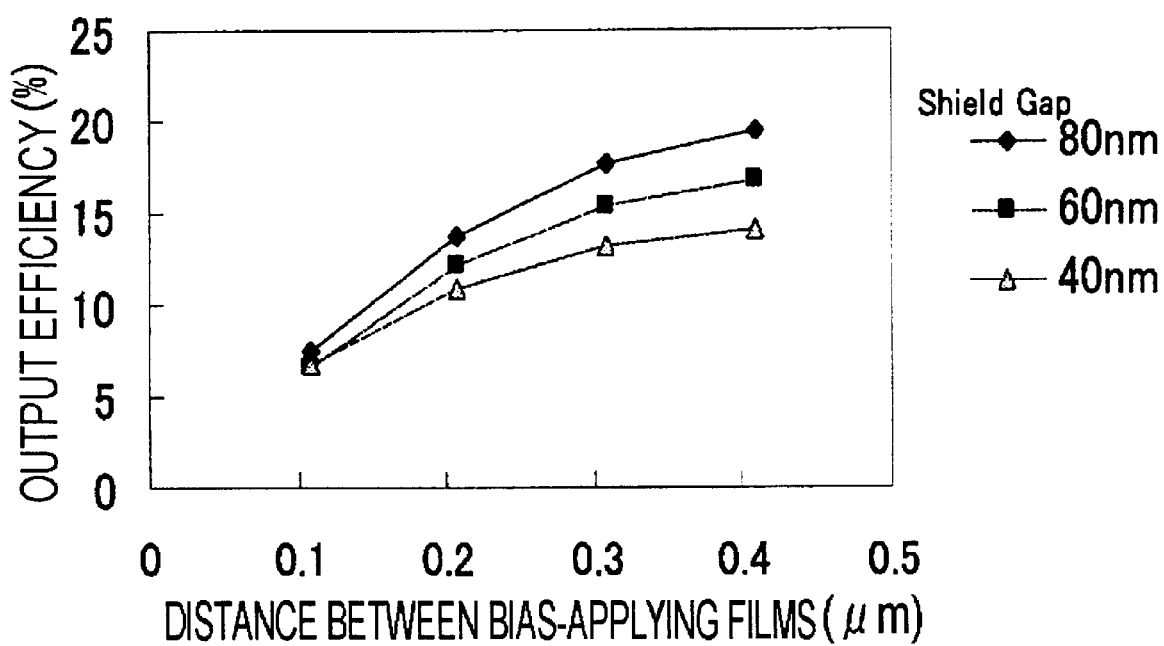
FIG. 4 is a graph showing a relationship between the distance Wb between bias-applying films 3 and the output efficiency of the magnetoresistive effect element.

FIG. 4 is a graph showing a relationship between the distance Wb between bias-applying films 3 and the output efficiency of the magnetoresistive effect element. It will be appreciated from the graph that the efficiency decreases as the distance between the bias-applying films 3 is narrowed. That is, as the distance between the bias-applying films 3, 3 is progressively narrowed for the purpose of increasing the density, the magnetoresistive effect film 1 becomes insensitive.

Figure 5:
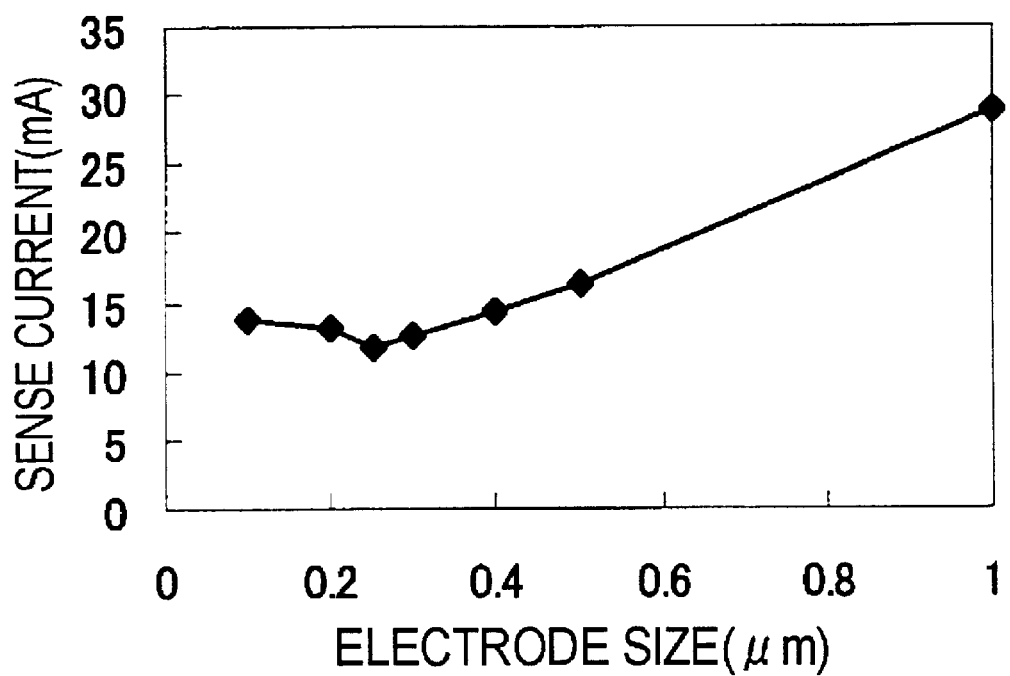
FIG. 5 is a graph showing a relationship between the upper limit sense current Im upon perpendicular introduction of a current and the size D of an electrode.

FIG. 5 is a graph showing a relationship between the upper limit sense current Im upon perpendicular introduction of a current and the size D of an electrode. In FIG. 5, the ordinate represents sense current values lowering the efficiency of the magnetoresistive effect element to 80% of its initial value (extrapolative value at zero sense current). This is herein called the "upper limit sense current Im". The abscissa of FIG. 5 represents the size of the electrode corresponding to its diameter in case of the electrode being circular.

It is appreciated from FIG. t that the upper limit sense current Im decreases as the electrode size D becomes smaller. This is because the sense current density increases, the intensity of the magnetic field caused by the current also increases, and the free layer of the magnetoresistive effect film 1 becomes more subjected to its adverse influences.

However, the upper limit sense current Im is minimum near the electrode size of 0.3 micron, and rather tends to increase as the electrode side D decreases. Its reason is assumed to lie in that the electrode becomes a ring having a larger curvature (smaller diameter) than the current-induced magnetic field as the electrode size decreases, but magnetization of the free layer is made more difficult to follow the sharp magnetic field with the large curvature by influences of exchange coupling occurring inside. The data of FIG. 5 are those obtained when the most typical NiFe (nickel-iron) ferromagnetic material is used as the free layer of the magnetoresistive effect film 1. Therefore, the data are the most typical data of magnetoresistive effect elements.

The electrode size is preferably small to increase the density. The Inventors have come to recognize through their own researches that an ultra-high density can be accomplished with the CPP type magnetoresistive effect element while minimizing the decrease of the efficiency by limiting the electrode size to 0.3 micron or less.

That is, in the configuration shown in FIGS. 1 and 2, if the size W1 of the smaller electrode 2A is 0.3 micron or less, then a magnetoresistive effect element having an ultra-high density and ensuring highly sensitive detection of the magnetic field can be realized.

On the other hand, in the embodiments of the invention, by setting the width W2 of the electrode 2B larger than the width W1 of the electrode 2A, a positional error between the upper and lower electrodes can be absorbed. If the upper and lower electrodes 2A, 2B are equal in size, a positional error between them may invite a large offset of the profile of the current flowing in the magnetoresistive effect film 1 from the perpendicular direction. Actually, under the condition corresponding to recording by ultra-high density of an electrode size of 0.3 micron or less, in which the embodiments of the invention ensures a remarkable effect as explained above, it is difficult to align the upper and lower electrodes in the order of this size. In contrast, by designing the electrode 2B larger as the embodiment of the invention proposes, it is possible to align the electrode 2A within the area opposed to the electrode 2B even when an error around tens of nanometers exists between positions of the upper and lower electrodes, and the current profile is maintained substantially unchanged. As a result, the embodiment of the invention can provide magnetoresistive effect elements effectively minimizing the output fluctuation by positional errors between electrodes.

Next explained is the second embodiment of the invention.

Figure 6:
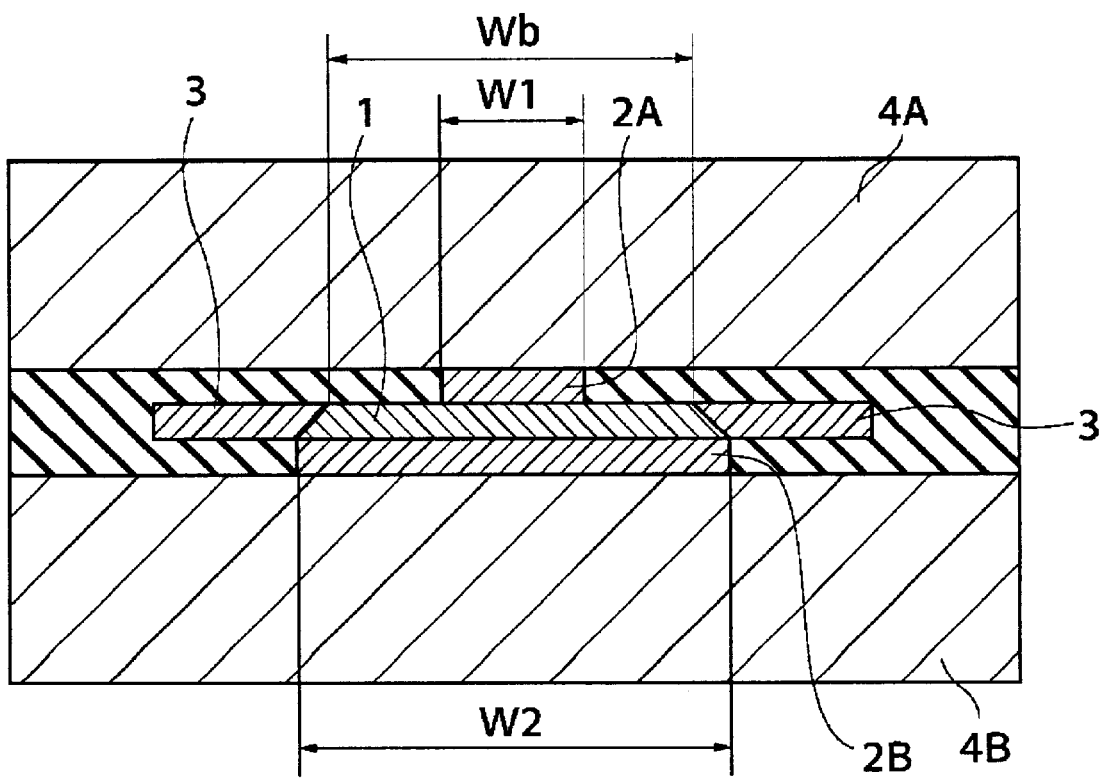
FIG. 6 is a cross-sectional view showing the significant part of a magnetic head having a CPP type magnetoresistive effect element according to the second embodiment of the invention.

FIG. 6 is a cross-sectional view showing the significant part of a magnetic head having a CPP type magnetoresistive effect element according to the second embodiment of the invention. Here again, the medium-facing surface is in this side of the plane of the drawing sheet.

Similarly to the embodiment shown in FIGS. 1 and 2, electrodes 2A, 2B are provided on and under the magnetoresistive effect film 1, and bias-applying films 3, 3 are formed at opposite sides of the magnetoresistive effect film 1. The magnetoresistive effect element including these components is sandwiched between a pair of magnetic shields 4A, 4B to form a magnetic head.

In this embodiment, the distance Wb between the bias-applying films 3, 3, width W1 of the contact surface between the electrode 2A and the magnetoresistive effect film 1, and width W2 of the contact surface between the electrode 2B and the magnetoresistive effect film 1 satisfy the following relationship.

$$W1 < W2 = Wb$$

Also in this configuration, as explained with reference to the first embodiment, it is possible to locally carry the sense current exclusively to the central part of the magnetoresistive effect film 1 by the electrode 2A, and apply the sense current substantially perpendicularly even under the existence of a positional error of tense of nanometers between the upper and lower electrodes 2A, 2B, while maintaining the current profile substantially unchanged. Here again, therefore, magnetoresistive effect elements minimized in output fluctuation can be realized.

This embodiment has the additional advantage of simplifying the manufacturing process because the magnetoresistive effect film 1 and the electrode 2B can be patterned simultaneously. Furthermore, since the possibility of positional errors is limited only between the magnetoresistive effect film 1 and the electrode 2A, fluctuation in the manufacturing process is further reduced.

Next explained is the third embodiment of the invention.

Figure 7:
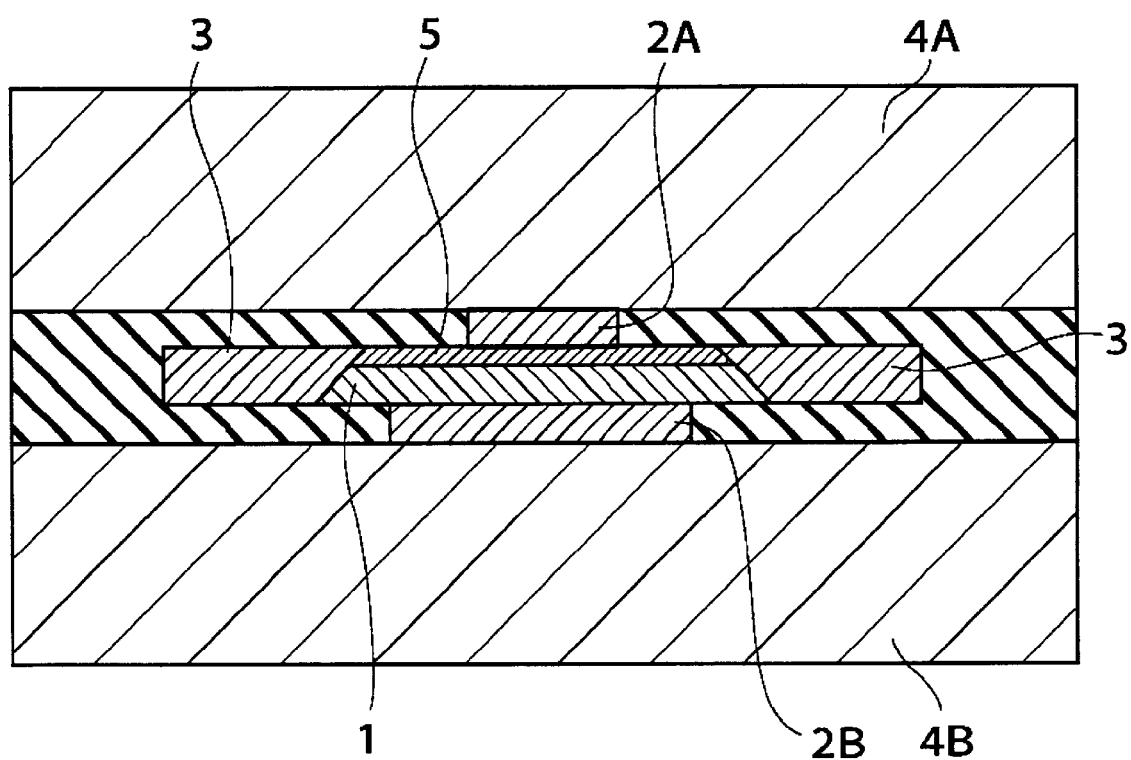
FIG. 7 is a cross-sectional view showing a magnetic head having a CPP type magnetoresistive effect element according to the third embodiment of the invention.

FIG. 7 is a cross-sectional view showing a magnetic head having a CPP type magnetoresistive effect element according to the third embodiment of the invention. Here again, the medium-facing surface is in this side of the plane of the drawing sheet. As explained with reference to FIGS. 1 through 6, electrodes 2A, 2B are provided on and under the magnetoresistive effect film 1, and bias-applying films 3, 3 are formed at opposite sides of the magnetoresistive effect film 1. In this embodiment, a high-resistance layer 5 is interposed between the magnetoresistive effect film 1 and the electrode 2A. The high-resistance layer 5 maybe mad of, for example, Cr (chromium), Ta (tantalum), or the like. The magnetoresistive effect element including these components is sandwiched between a pair of magnetic shields 4A, 4B to form a magnetic head.

Here again, the distance Wb between the bias-applying films 3, 3, width W1 of the contact surface between the electrode 2A and the magnetoresistive effect film 1, and width W2 of the contact surface between the electrode 2B and the magnetoresistive effect film 1 satisfy the same relationship as that of the first embodiment or the second embodiment, and the above-mentioned various effects are similarly obtained.

In the embodiment shown here, using the high-resistance layer 5 interposed between the narrower electrode 2A and the magnetoresistive effect film 1, undesirable dispersion of the current can be prevented when the current flows from the narrow electrode into the wide magnetoresistive effect film 1, and therefore, degradation of the sensitivity and enlargement of the effective track width can be prevented.

Mechanisms of these effects will be explained below in conjunction with the drawings.

Figure 8A:
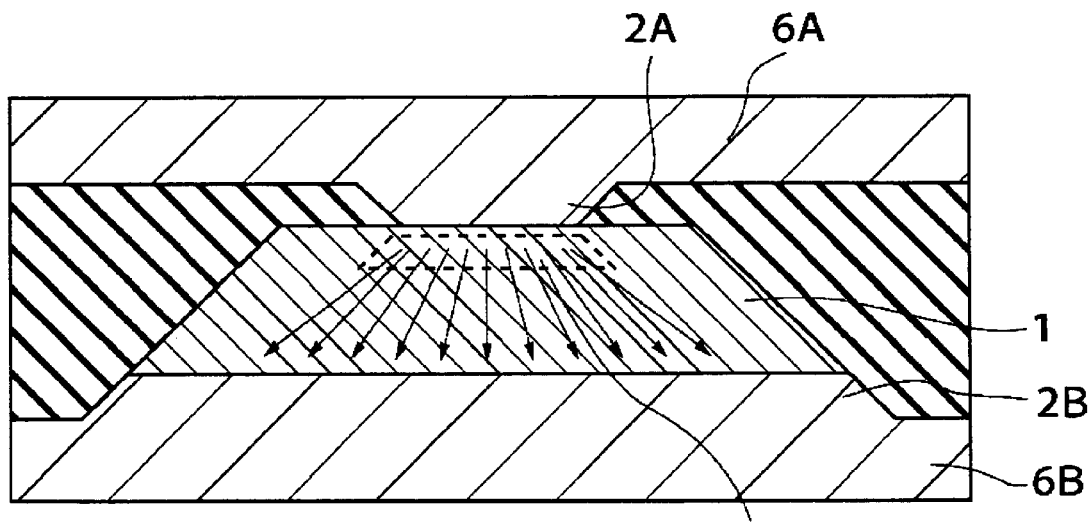
Figure 8B:
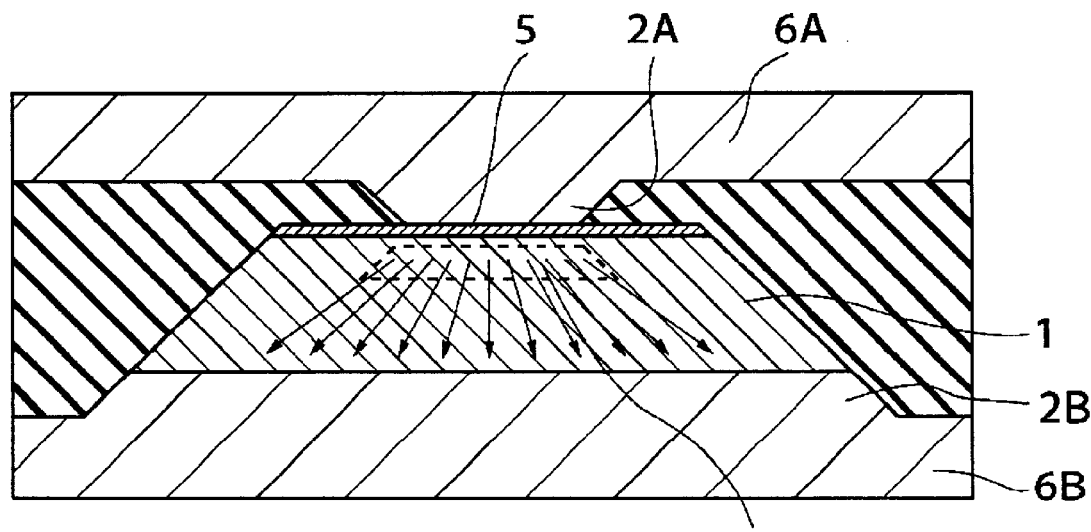

FIGS. 8A and 8B are rough diagrams for explaining effects of a high-resistance layer 5, in which FIG. 8A is a cross-sectional view schematically showing the profile of the sense current in a configuration without the high-resistance layer 5, and FIG. 8B is that in a configuration including the high-resistance layer 5.

As shown in FIG. 8A, in the configuration without the high-resistance layer 5, the current profile tends to spread out near the electrode 2A when the current flows from the electrode 2A toward the magnetoresistive effect film 1 and the electrode 2B. This results in producing the tendency that the current densely distributes in outer regions of the current profile near the electrode 2A. That is, near the electrode 2A, the current profile becomes dense in outer regions and thin in the inner region.

Once such a current profile is formed, since the current density is higher in outer regions than in the central region within the magnetoresistive effect film 1, the central portion of the sensitivity track profile degrades. Therefore, the half width at half maximum of the track profile increases, and the effective track width is enlarged. That is, it becomes difficult to cope with high-density magnetic recording.

In contrast, in the configuration of FIG. 8B, having the high-resistance layer 5, the current profile tends to be uniformed before reading the high-resistance layer 5 while the sense current flows from the electrode 2A toward the magnetic resistance film 1 and the electrode 2B. That is, near the electrode 2A, the current profile is more even. Therefore, within the magnetic resistance film 1, the sense current flows more uniformly from the electrode 2A toward the electrode 2B. As a result, a favorable track profile is obtained, thereby to minimize enlargement of the effective track width and cope with magnetic recording by ultra-high densities.

Especially when the width of the electrode 2A is reduced in size to 0.3 micron or less, as referred to with reference to FIG. 5, the high-resistance layer 5 effectively adjusts the current profile.

When the high-resistance layer 5 exists between the electrode and the magnetoresistive effect film, the term "contact surface" contemplates the surface of the electrode in electrical contact with the high-resistance layer 5.

Next explained is the fourth embodiment of the invention.

Figure 9:
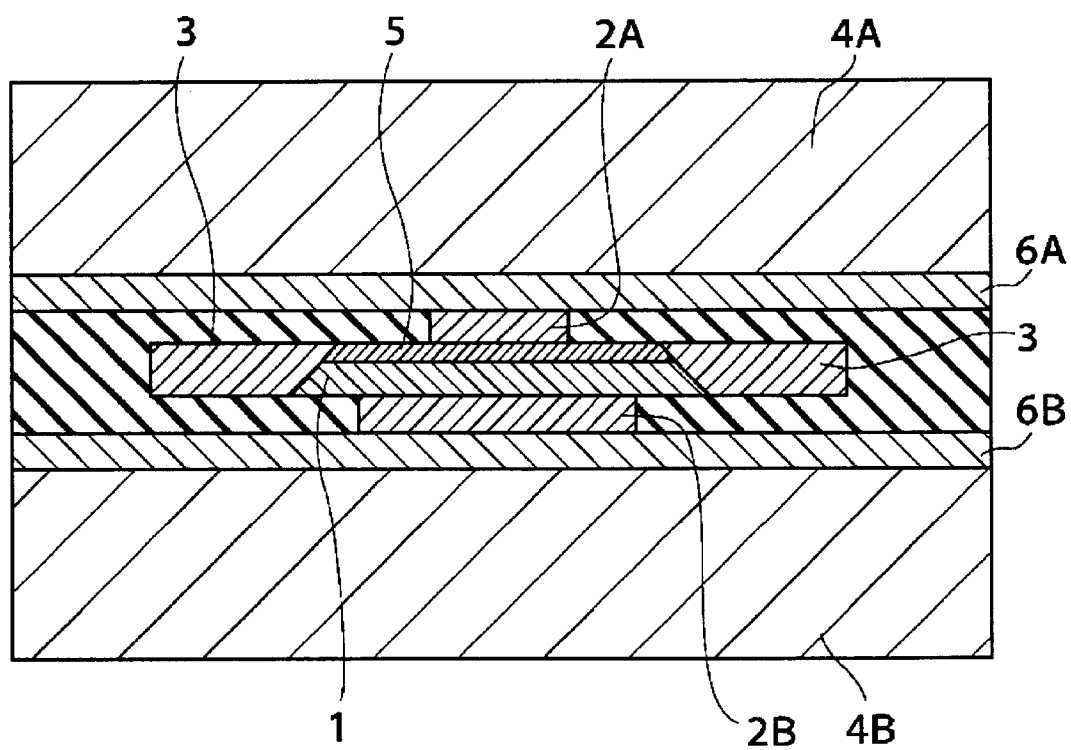
FIG. 9 is a cross-sectional view showing a magnetic head having a CPP type magnetoresistive effect element according to the fourth embodiment of the invention.

FIG. 9 is a cross-sectional view showing a magnetic head having a CPP type magnetoresistive effect element according to the fourth embodiment of the invention. Here again, the medium-facing surface is in this side of the plane of the drawing sheet.

Similarly to the embodiments shown in FIGS. 1 through 8, electrodes 2A, 2B are provided on and under the magnetoresistive effect film 1, and bias-applying films 3, 3 are formed at opposite sides of the magnetoresistive effect film 1. This embodiment, however, additionally uses a high-resistance layer 5 interposed between the magnetoresistive effect film 1 and the electrode 2A. The magnetoresistive effect element including these components is sandwiched between a pair of magnetic shields 4A, 4B to form a magnetic head.

Furthermore, the embodiment shown here includes current-carrying layers 6A, 6B located inside the pair of magnetic shields 4A, 4B. The current-carrying layers 6A, 6B are made of a material having a lower resistance than that of the magnetic shields 4A, 4B, such as Au (gold), for example.

In this embodiment using the current-carrying layers 6A, 6B, the sense current outside the electrodes 2A, 2B is substantially guided to flow in the current-carrying layers 6A, 6B. As a result, the magnetic shields 4A, 4B are prevented from saturation by the current-induced magnetic field neat the electrodes 2A, 2B. If the current carrying layers 6A, 6B are not used, the sense current outside the electrodes 2A, 2B will flow in the magnetic shields 4A, 4B. In this case, since the sense current having flown through (or leaked out of) the wide areas of the magnetic shields 4A, 4B concentrate at the contact surfaces of the electrodes 2A, 2B, which are as if bottle necks for that current, the current density increases there, and the intensity of the current-induced magnetic field also increases. This may result in locally magnetically saturating the magnetic shields and losing their shielding function.

In contrast, in the configuration using the current-carrying layers 6A, 6B having a low specific resistance, the sense current does not flow in the magnetic shields 4A, 4B, and their saturation by the current-induced magnetic field can be prevented.

Next explained are some methods of applying the sense current in the present embodiment.

Figure 10A:
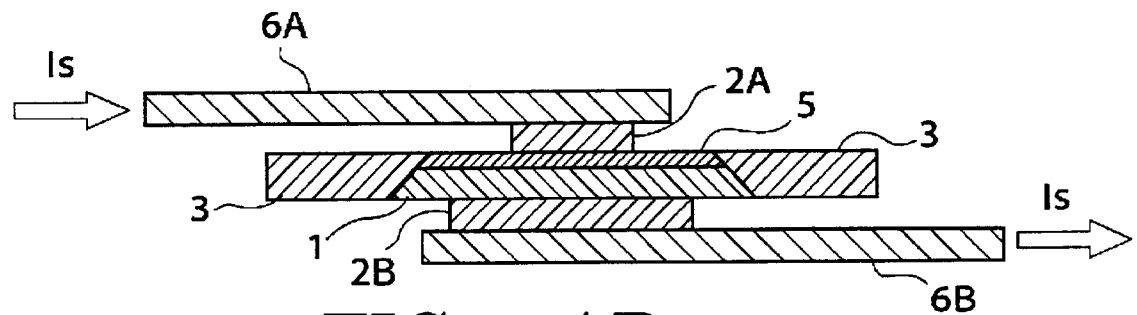
FIGS. 10A through 10C are cross-sectional views of the CPP type magnetoresistive effect element according to the fourth embodiment of the invention.
Figure 10B:
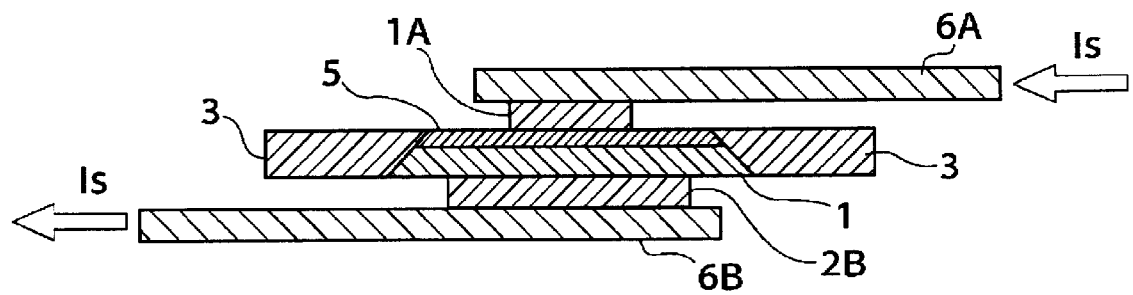
Figure 10C:
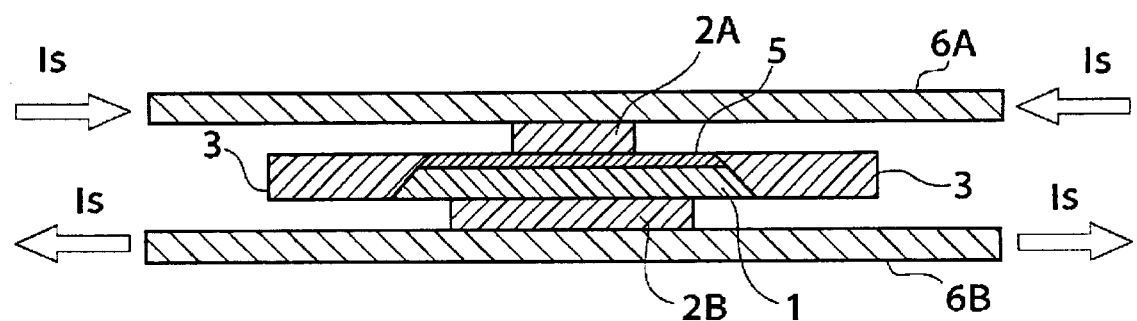

FIGS. 10A through 10C are cross-sectional views of the CPP type magnetoresistive effect element according to the fourth embodiment of the invention. FIGS. 10A through 10C illustrate only its significant part, namely upper and lower current carrying layers 6A, 6B and the structure between them in the configuration of FIG. 9.

In the configuration of FIG. 10A, the sense current Is is supplied in the current-carrying layer 6A from left to right on the drawing sheet in parallel to the medium-facing surface, and after flowing through the magnetoresistive effect film 1, flows in the current-carrying layer 6B rightward.

In contrast, in the configuration of FIG. 10B, the sense current Is is supplied in the current-carrying layer 6A in parallel to the medium-facing surface from right to left on the drawing sheet, and after flowing through the magnetoresistive effect film 1, flows in the current-carrying layer 6B leftward.

On the other hand, in the configuration of FIG. 10C, the sense current Is is supplied from right and left in parallel to the medium-facing surface, and also after flowing through the magnetoresistive effect film 1, flows in the current-carrying layer 6B to both right and left. By having the sense current flow in both right and left directions, it is possible to reduce adverse influences of the magnetic field induced by the sense current acting especially strong near the junctions between the current-carrying layers 6A, 6B and the electrodes 2A, 2B.

The ways of supplying the current shown in FIGS. 10A through 10C can be used also when supplying the sense current via the magnetic shields without using the current-carrying layers, and still ensure the same effects.

Next explained is a specific example of manufacturing method of a magnetic head having electrodes narrower than the distance between bias-applying films 3, 3, taken as the fifth embodiment of the invention.

FIGS. 11A through 11F and FIGS. 12A through 12E are cross-sectional views of a magnetic head according to an embodiment of the invention under a manufacturing process of its significant part.

Figure 11A:
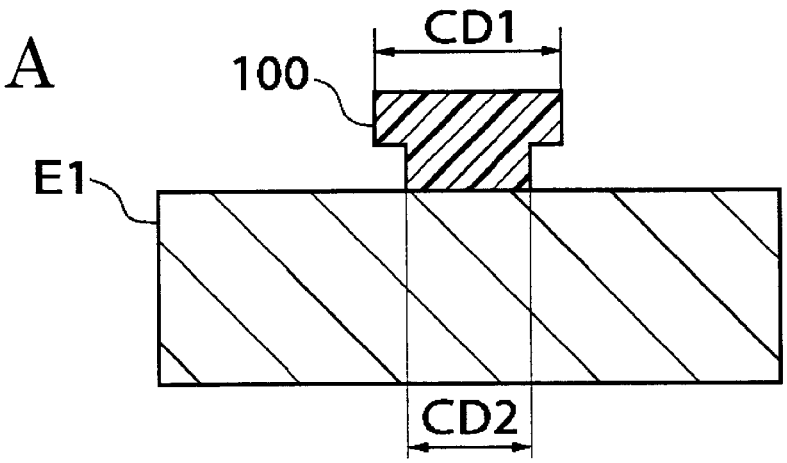

First referring to FIG. 11A, for the purpose of forming a lower pillar for supplying the sense current to the GMR film, a mask 100 of an EB (electron beam) resist, for example, is formed on the lead E1. The electrode 2A may be made of a structure laminating, for example, Ta (10 nm thick), Cu (20 nm thick) and Ta (10 nm thick) sequentially from the bottom. The lead E1 is the portion that will become the current-carrying layer 6A and the electrode 2A later.

The mask 100 may be made by shaping the resist into the form of T in cross-section such that it top surface forms a square having the width CD1 of approximately 0.25 $\mu$m, each side, and the bottom surface forms a square having the width DC2 of approximately 0.15 $\mu$m, each side. Under the electrode 2A, a lower shield (not shown) is provided. When an EB resist mask is used, a positive type resist is preferably used to facilitate formation of the reversely tapered shape lift-off removal of an insulting film explained later.

Figure 11B:
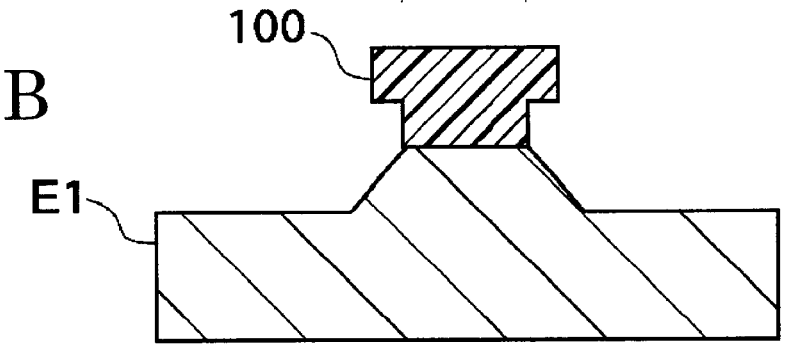

Next referring to FIG. 11B, the lead E1 is selectively removed by ion milling or other appropriate technique to the depth of approximately 20 nm for patterning of the lower pillar (electrode 2A).

Figure 11C:
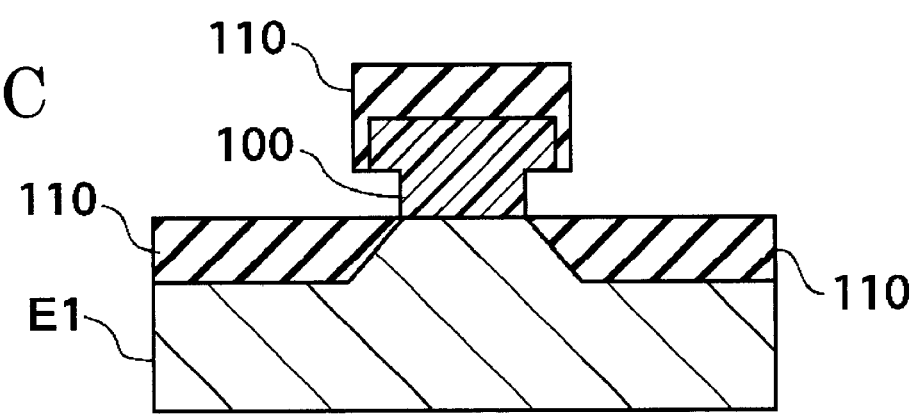

Next as shown in FIG. 11C, an insulating film 110 of $SiO_2$, for example, is formed up to the thickness of approximately 20 nm.

Next as shown in FIG. 11D, the resist mask 100 is removed by lift-off technique to obtain the structure buried by the insulting film 110 around the lower pillar L.

Next as shown in FIG. 11E, the GMR film 1 is formed, and a photo step is carried out to form a T-shaped resist mask 120 thereon.

Next as shown in FIG. 11F, the GMR film 1 is patterned by ion milling or other method.

Figure 12A:
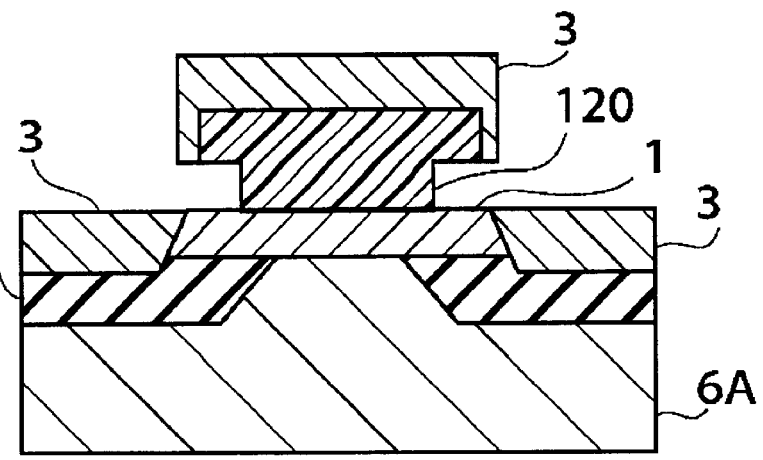
FIGS. 12A through 12E are cross-sectional views of the same magnetic head under the same manufacturing process.

Next as shown in FIG. 12A, while maintaining the resist mask 120 there, the bias-applying film 3 of CoPt alloy, for example, is formed.

Figure 12B:
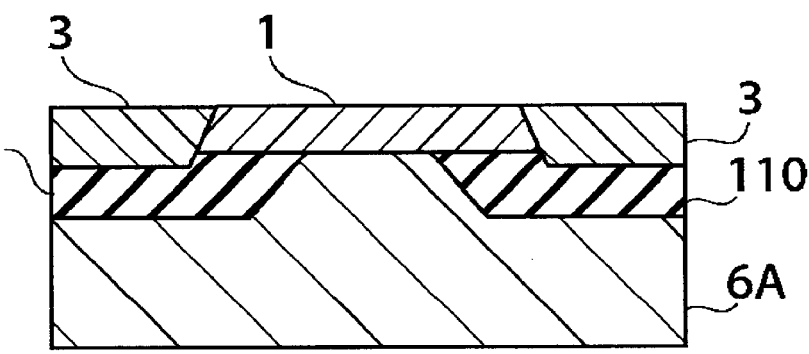

Next as shown in FIG. 12B, the resist mask 120 is removed by lift-off technique, and the bias applying film 3 is patterned.

Figure 12C:
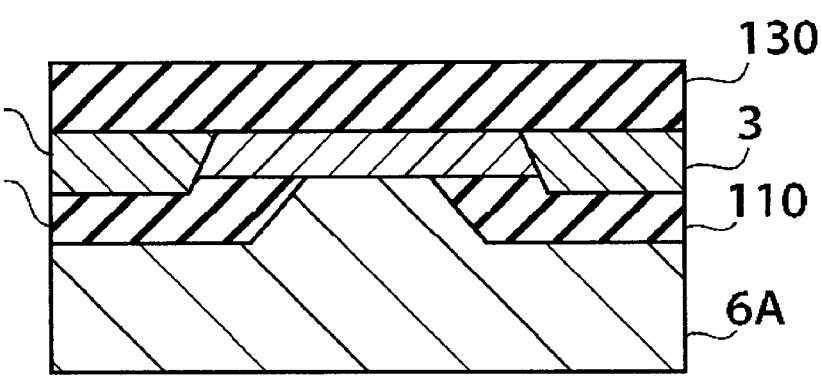

Next as shown in FIG. 12C, an insulating film 130 of $SiO_2$, for example, is formed up to the thickness of approximately 20 nm.

Figure 12D:
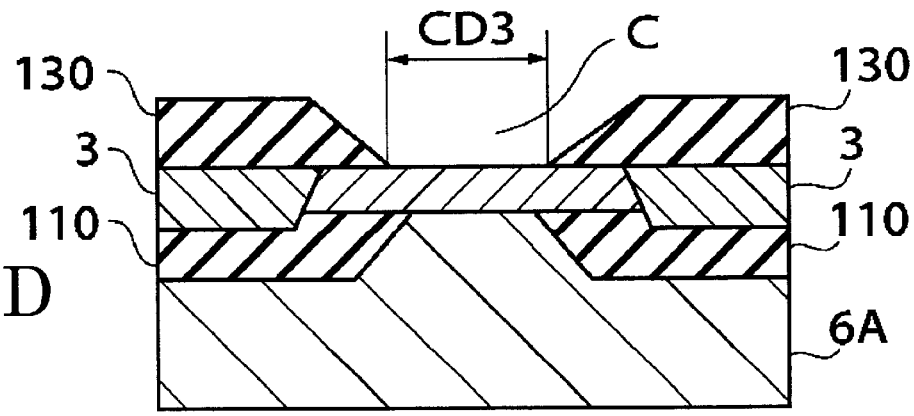

Then as shown in FIG. 12D, a contact hole C for making an upper pillar is made in the insulating film 130 by RIE (reactive ion etching), for example.

In this case, if the widths W2, W1 of the upper and lower electrodes are finally equalized, then the contact hole C for the upper pillar has to be aligned with the lower pillar LP.

More specifically, in order to limit the accuracy of alignment of the upper pillar UP (for the contact hole) with the lower pillar LP within±0.05 $\mu$m, width CD3 (corresponding to W2) of the upper pillar UP must be approximately 0.25 $\mu$m or more.

In order to accurately align these upper and lower pillars, a resist mask is preferably used to cover the alignment target (marker) such that the GMR film is not formed thereon. In the photo step of FIG. 11E, a photo mask is preferably formed also on the target such that the shape of the target is not broken in the patterning process of the GMR film 1.

In contrast, according to the embodiment of the invention, as explained with reference to the first to fourth embodiments, allowance for the "positional error" can be enlarged by setting the width of the top surface of the lower pillar LP (corresponding to W1) wider than the width of the bottom surface of the upper pillar UP (corresponding to W2). As a result, the width CD3 of the upper pillar (corresponding to the width W2) can be significantly decreased while significantly relaxing the alignment accuracy required in the manufacturing process.

Figure 12E:
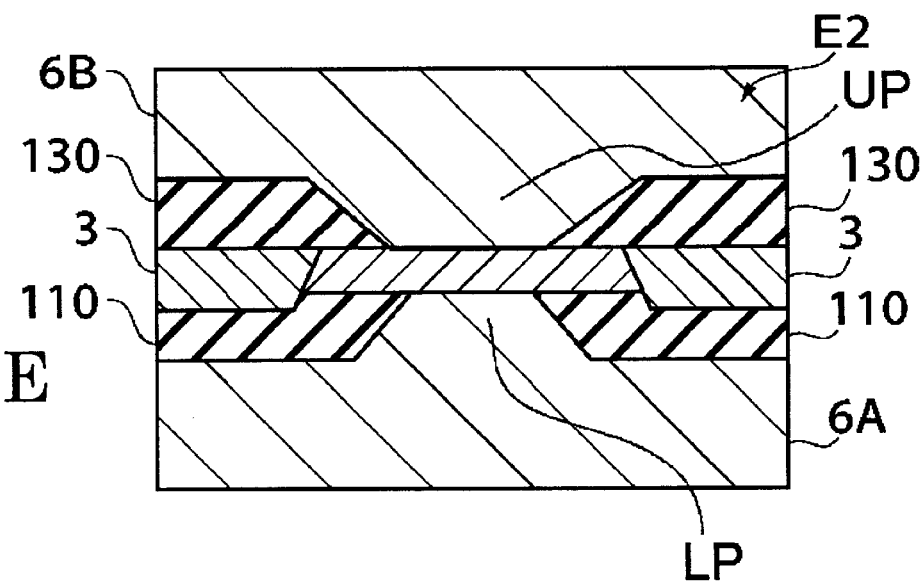

Next as shown in FIG. 12E, the upper lead E2 is formed to bury the contact hole C. The lead E2 may be a multi-layered structure of, for example, Ta (5 nm thick), Cu (20 nm thick) and Ta (t nm thick) that are laminated sequentially from the bottom. Part of the lead E2 buried in the contact hole C will become the electrode 2B (upper pillar UP), and the other upper part thereof will become the current-carrying layer 6B.

After that, once the upper shield 4 (not shown) is formed, the significant of the reproducing magnetic head is completed.

As explained above, according to the invention, by changing the upper and lower pillars in size (electrode width) from each other, "variance" of alignment inside each wafer and among different wafers, and variance of pillar sizes can be absorbed. Therefore, the lower pillar is ensured to lie within the range of the upper pillar. This results in uniforming the sense current profile among different elements and thereby remarkably improving the production yield.

In the specific example shown in FIGS. 11A through 12E, the upper pillar (UP) is made larger than the lower pillar (LP) for the reasons explained below.

In case of this specific example, as already explained with reference to FIGS. 12D and 12E, the electrode layer has to be formed to bury the contact hole C for the purpose of making the upper pillar (UP). This process is easier when the pillar size (CD3) is larger than the depth to be buried (that is, the aspect ratio between the depth and the width is small).

In contrast, upon making the lower pillar (LP), since the layer E1 is first formed flat and thereafter selectively removed by etching, as already explained with reference to FIGS. 11A and 11B, the process is relatively easier even when the pillar size (CD2) is small.

Therefore, setting the size of the upper pillar larger than the size of the lower pillar is advantageous for easier formation of the upper pillar and for a wider margin in the manufacturing process. This apparently contributes to improving the production yield.

Figure 13A:
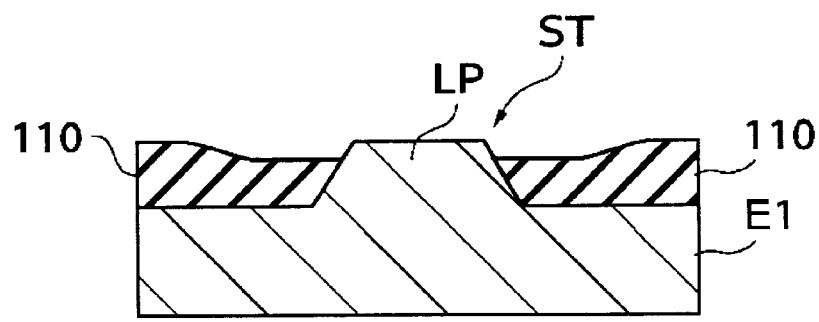
FIGS. 13A through 13D are cross-sectional views schematically showing the smoothing processes of the surfaces of the lower pillar LP and the insulating films 110.

In the step shown in FIG. 11D, if a discontinuous level difference ST is produced between the surface of the lower pillar LP and the insulating film 110 as shown in FIG. 13A, then the magnetic domain become unstable due to magnetization of the GMR film at the level difference, and it may results in inducing the Barkhausen noise. This problem, however, can be remedied by smoothing the surface to form a continuous surface over the extension from the edge of the pillar LP to the insulating film 110 by CMP (chemical mechanical polishing), for example, thereby to more reliably stabilize the magnetic domain of the GMR 1 and prevent the Barkhausen noise.

Figure 13B:
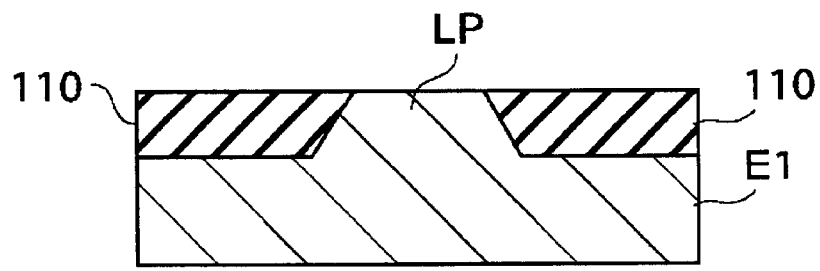
Figure 13C:
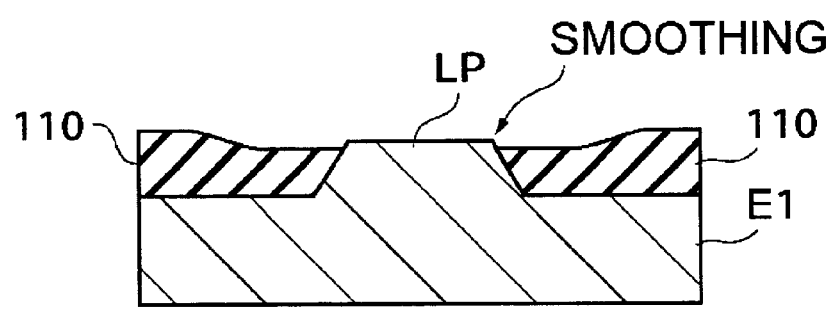
Figure 13D:
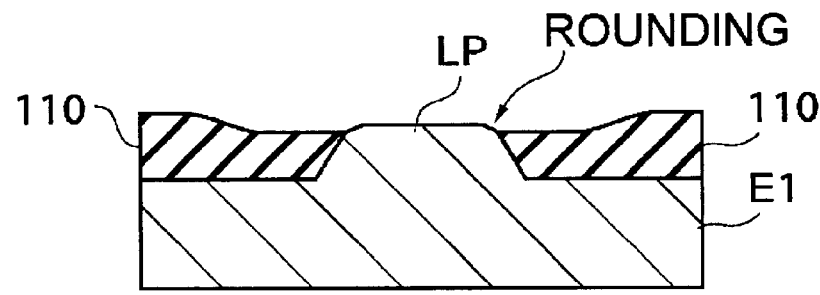

Acceptable manners of leveling include the configuration shown in FIG. 13B in which the surface has been completely leveled, the configuration shown in FIG. 13C in which the boundary area between the pillar LP and the insulating film 110 has been smoothed gently, and the configuration shown in FIG. 13D in which the corners of the pillar LP have been rounded. Any of the configurations of FIGS. 13B through 13C is considered effective for preventing the Barkhausen noise.

However, if polishing and smoothing by the etch-back technique is excessive, it may invite electrical leakage of between the GMR film 1 and the electrode 2B due to an excessive decrease of the thickness of the insulating film 110, or a change of the width W1 at the junction with the electrode 2A in case the pillar LP is tapered. Tanking it into consideration, if the method of rounding the corners of the pillar LP is employed as shown in FIG. 13D, the thickness lost by polishing or etch-back processing is preferably limited within a small value.

The lower pillar LP can be etched sharply by RIE. According to this method, since the taper is steeper, the change of the pillar size by CMP or etch-back processing can be reduced. In this manner, the lower pillar (electrode 2A) of the size of 0.15 $\mu$m each side can be made reliably.

Next explained is a method that can absorb the alignment error even when the upper and lower electrodes 2A, 2B are substantially equal in size.

Figure 14:
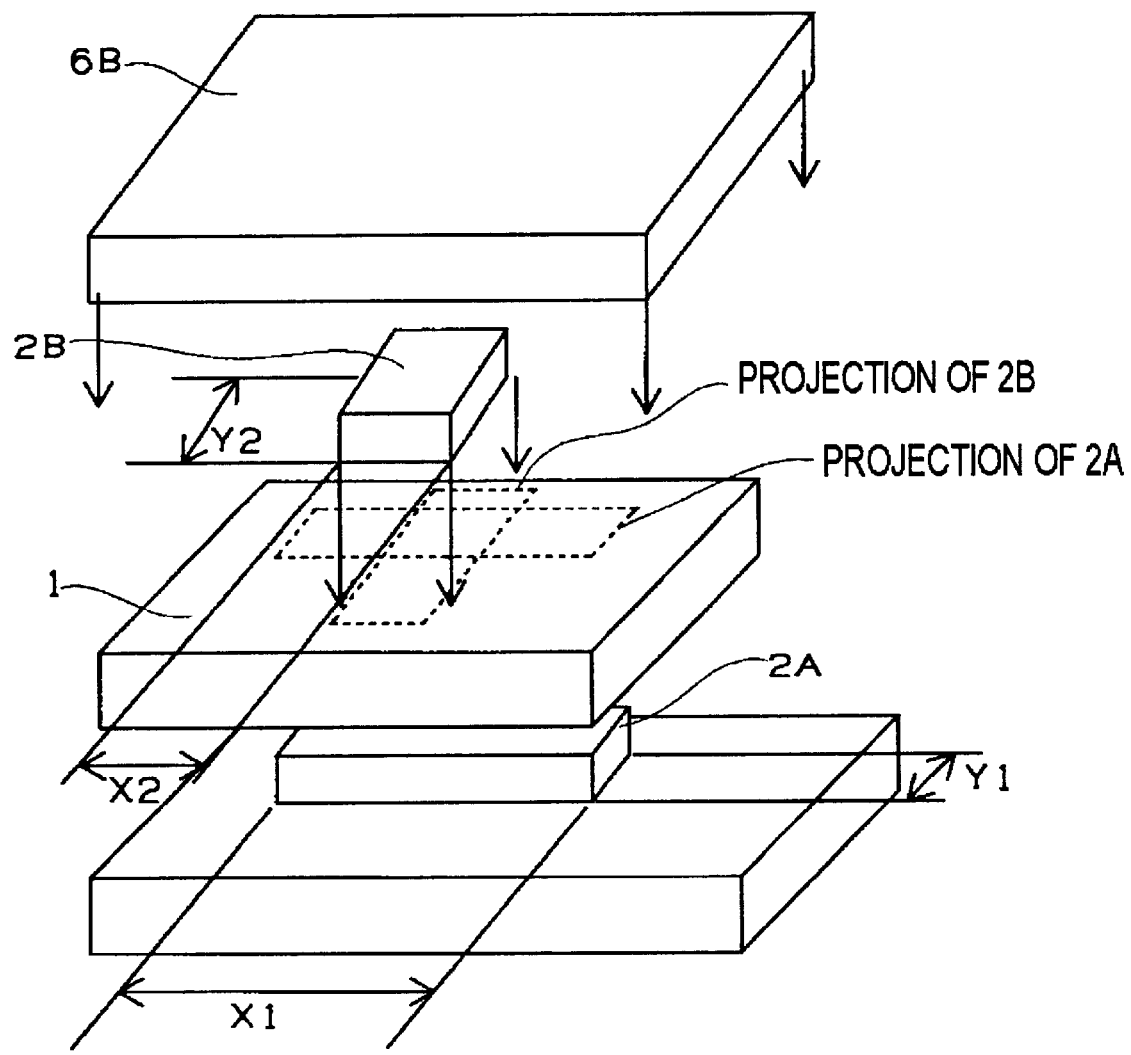
FIG. 14 is a perspective view showing a method capable of absorbing alignment errors even when upper and lower electrodes 2A, 2B are approximately equal in size.

FIG. 14 is an exploded perspective view showing the outline of this method. Regarding the manufacturing process, the same process as those explained with reference to FIGS. 11A through 13D can be here again employed essentially. The outline thereof is explained below with reference to FIGS. 11A through 14.

First in the step shown in FIG. 11A, this method makes the lower lead E1 in form of a multi-layered structure of, for example, Ti (10 nm thick), Cu (100 nm thick), Cr (5 m thick) and Ti (20 nm thick) that are laminated sequentially from the bottom.

In the step of patterning the lower electrode shown in FIG. 11B, the upper Ti layer (20 nm thick) is selectively etched by RIE using a freon-based gas. The pillar used here is rectangular and sized as X1=0.15 $\mu$m, Y1=0.10 $\mu$m in FIG. 14. By patterning Ti by RIE, an approximately perpendicular cross-sectional shape is obtained as the pillar, and the etching depth can be accurately regulated to 20 nm to just reach the Cr surface. Cr (5 nm thick) serves as an etching stopper upon RIE and also functions to reinforce the adhesive force of the insulating film to be formed thereon.

After that, as shown in FIG. 11C, a $SiO_2$ film is formed as the insulating film 110 up to a thickness around 25 nm.

Then as shown in FIG. 11D, the resist mask 100 is removed, and the surface is smoothed by CMP.

Thereafter, the same process as that already explained with reference to FIGS. 11E through 12C can be progressed.

In the step of making the contact hole C shown in FIG. 12D, patterning is carried out so as to make a pattern of a rectangle as large as X2=0.10 μm and Y2=0.15 μm in FIG. 14 and orient its lengthwise direction relatively rotated by 90 degrees from that of the lower pillar. That is, in this patterning, the width CD3 in FIG. 12E is 0.10 μm and the depth is 0.15 μm.

After that, as explained with reference to FIG. 12E, the upper lead E2 is formed to bury the contact hole C. The wafer thus obtained is thereafter cut along predetermined cutting lines, depending upon the purpose of its use. When the element is used in a magnetic head, by cutting the wafer near the cross portion where the upper and lower electrodes overlap, a magnetic head using the cross region as the sensing area can be obtained.

As explained above, this method makes the upper and lower electrodes (pillars) in rectangular shapes that cross approximately at right angles as shown in FIG. 14. In this manner, even when the upper and lower pillars are misaligned, their overlapping area does not change. Therefore, the current-carrying mode is stabilized, and the CPP component of the current flowing in the magnetoresistive effect film 1 can be maintained by a high ratio. As a result, output variance and track width variance on the wafer plane can be reduced.

In the above-explained specific example, Ti is used as the lower electrode 2A and Cu as the lower current-carrying layer 6A. Using RIE for processing pillars is advantageous for obtaining a sharp taper. As already explained with reference to FIG. 13D, this contributes to relaxing the process margin and improving the production yield because the area of the upper surface of the pillar is less variable even when the lower pillar is partly removed in the smoothing process.

In case the lower current-carrying layer and the lower pillar (electrode) are exposed to the medium-running surface, a material excellent in corrosion resistance, such as Ti, Ta, W, MoW alloy, or the like, is preferably used. Additionally, a metal stopper layer high resistant to RIE may be inserted along the boundary between the current-carrying layer and the electrode.

Side etching under the EB resist mask 100 can be brought about by using much chemical components as a condition of RIE and using CDE (chemical dry etching).

FIGS. 15A through 15F are cross-sectional views schematically showing how side etching occurs and progresses under the mask 100.

Figure 15A:
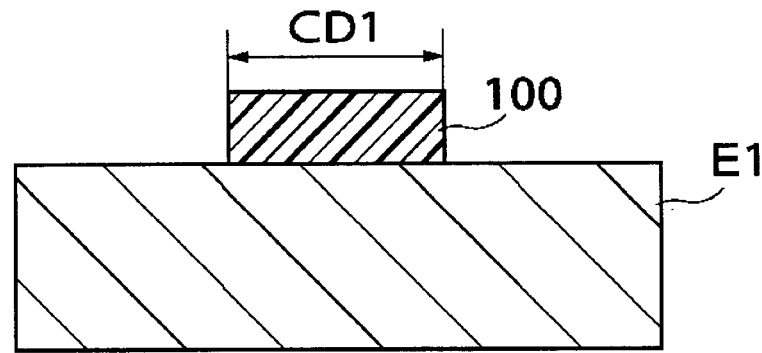

As shown in FIG. 15A, a photoresist mask 100 for making the lower pillar having the width of 0.25 μm (CD1) is formed on the lead E1 of MoW alloy by using an i line exposure apparatus.

Figure 15B:
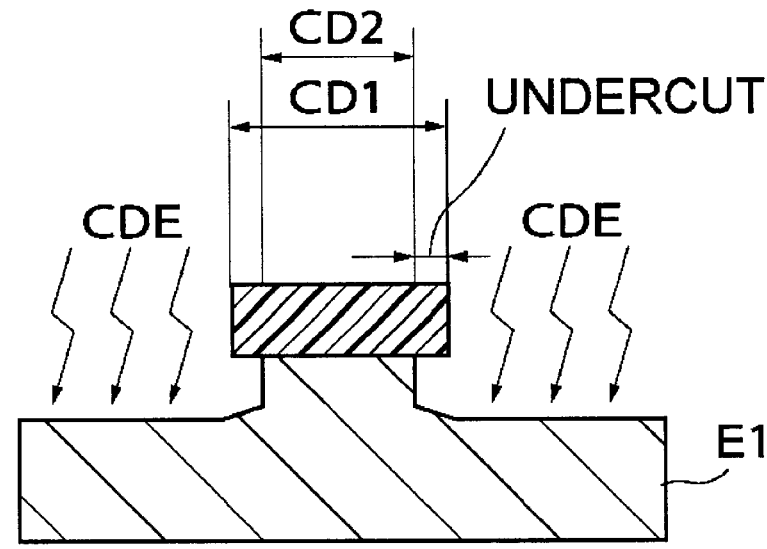

Then, as shown in FIG. 15B, the lead E1 is etched by approximately 0.08 μm by using CDE by $CF_4$ gas. As a result of this etching, a recess having the depth of 0.08 μm was made, and side etching of approximately 0.08 μm to below the photo resist mask 100 occurred. That is, the width CD2 in this figure was 0.09 μm.

In this manner, by patterning by CDE enabling isotropic etching, side etching can be formed so as to shape the resist mask 100 as a "canopy". Making the canopy, the $SiO_2$ film to be next formed can be removed easily and reliably by the lift-off technique. That is, level-to-level disconnection of the insulating film 110 can be promoted; the insulating film 110 can be separated easily by using the mask 100; and no flush remains after the mask is removed. As a result, excellent GMR properties are obtained.

Further, it is also possible to form the electrode narrower than the mask 100 simultaneously. If the side of the lower pillar is reduced to 0.1 μm, it is difficult to make it by exposure using light from the viewpoint of the resolution. On the other hand, lithography by EB (electron beam) involves the problem of machine cost in case of field lithography, and the problem of throughput in case of direct lithography.

However, when using the technique shown in FIGS. 15A through 15E, minute pillars can be made by using the mask formed in the optical exposure step. For example, since an i line exposure apparatus or KrF excimer laser exposure apparatus can be used, the throughput is improved drastically as compared with exposure by EB such as EB direct lithography, or the like. More specifically, while using a mask having the width of 0.25 μm formed by i-line exposure, for example, the lower pillar having the width of 0.09 μm can be made.

Figure 15C:
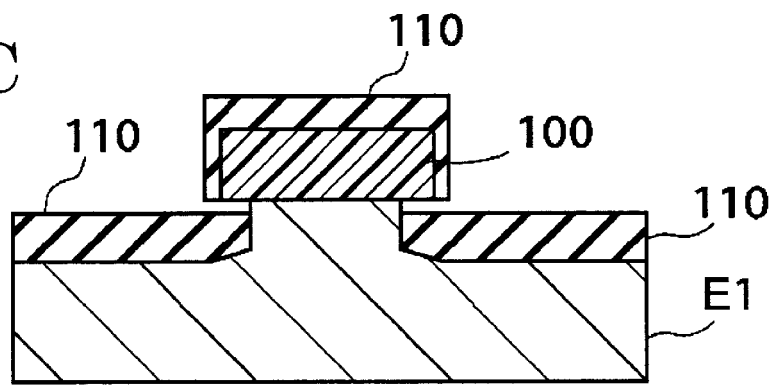
Figure 15D:
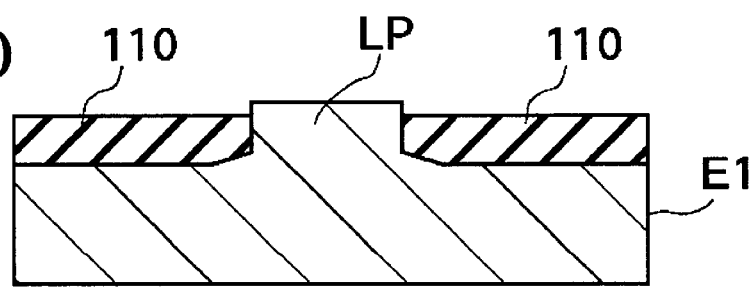
Figure 15E:
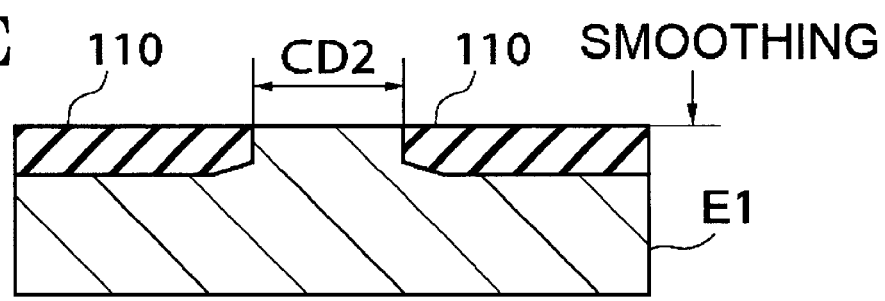

This step is followed by forming the $SiO_2$ film 110 to the thickness of approximately 0.07 μm, as show in FIG. 15C, removing it by lift-off as shown in FIG. 15E, and smoothing the surface by CMP as shown in FIG. 15E, to obtain the lower pillar (electrode 2A).

In FIG. 15B, instead of patterning the MoW alloy only by CDE, etching by RIE may be carried out before etching by CDE, there by to improve the controllability of the pillar width. With CDE alone, the etching profile is liable to vary, depending upon conditions of the metal surface such as oxidation and contamination thereof. Taking it into account, it is effective to first carry out etching by RIE or ion milling and then undertake etching by CDE and the process of forming the canopy, for improving the reproducibility and minimizing the variance. It is more effective to continuously carry out the RIE (or ion milling) step and the CDE step without breaking the vacuum because the problems of surface oxidation layer and surface contamination are prevented.

Heretofore, the first to fifth embodiments have been explained.

The embodiments of the invention will be further explained below, taking some examples.

(First Example)

Figure 16:
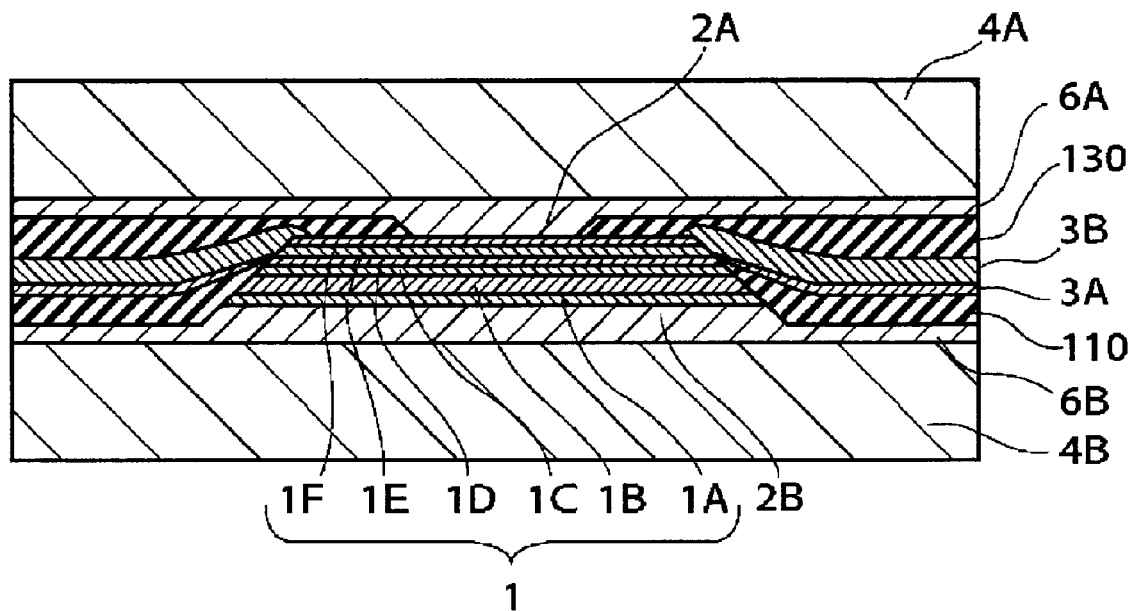
FIG. 16 is a cross-sectional view of the significant part of a magnetic head using a CPP type magnetoresistive effect element according to the first example of the invention.

FIG. 16 is a cross-sectional view of the significant part of a magnetic head using a CPP type magnetoresistive effect element according to the first example of the invention. Here again, the medium-facing surface is in this side of the plane of the drawing sheet.

In the magnetic head shown here, a magnetic shield 4B of NiFe, current-carrying layer 6B of Cu and electrode 2B of Cu are sequentially formed on a substrate, not shown, and the GMR film 1 is formed thereon.

The GMR film 1 has a structure including a base layer (Ta) 1A, antiferromagnetic layer (PtMn) 1B, pinned layer (CoFe/Ru/CoFe) 1C, spacer layer (Cu) 1D, free layer (CoFe/NiFe) 1E and protective layer (Ta) 1F that are laminated sequentially from the substrate side.

On the GMR film 1, the electrode 2A of Cu, current-carrying layer 6A of Cu, and magnetic shield 4A of NiFe) are formed. At opposite sides of the GMR film 1, the insulating film ($Al_2O_3$) 110, bias-applying film base layer (Cr) 3A, bias-applying film (CoCrPt) 3B and insulating film ($Al_2O_3$) 130 are formed in this order.

In this example, the electrode 2A is narrower than the distance between the bias-applying films 3B, 3B, and the central part of the GMR 1 having a higher sensitivity is defined as the sensing area. Additionally, since the current-carrying layers 6A, 6B are formed inside the magnetic shields 4A, 4B, the shields can be prevented from saturation by the current-induced magnetic field, and expansion of the gap length is prevented accordingly.

In this example, since the electrode 2B is wider than the electrode 2A, the sense current profile slightly spread in the GMR film 1 from the part nearer to the electrode 2A toward the electrode 2B. However, since the free layer 1E for detecting the magnetic flux from the recording medium, not shown, is formed nearer to the narrower electrode 2A, enlargement of the effective track width by spreading of the sense current can be minimized. Therefore, the free layer of GMR is preferably formed nearer to the narrower electrode in the embodiments of the invention.

In case the gap-to-gap distance of the magnetic head has to be smaller than the thickness from the electrode 2A to the electrode 2B, it is recommended to combine the element with a flux guide. Such a flux guide may be an extended part of the GMR film, which extends from the whole GMR film or extends at least from the magnetically free layer of GMR film toward the medium-facing surface of the head. Alternatively, the flux guide may be a soft magnetic layer which is magnetically connected to the free layer of the GMR film.

(Second Example)

Next explained is the second example of the invention.

Figure 17:
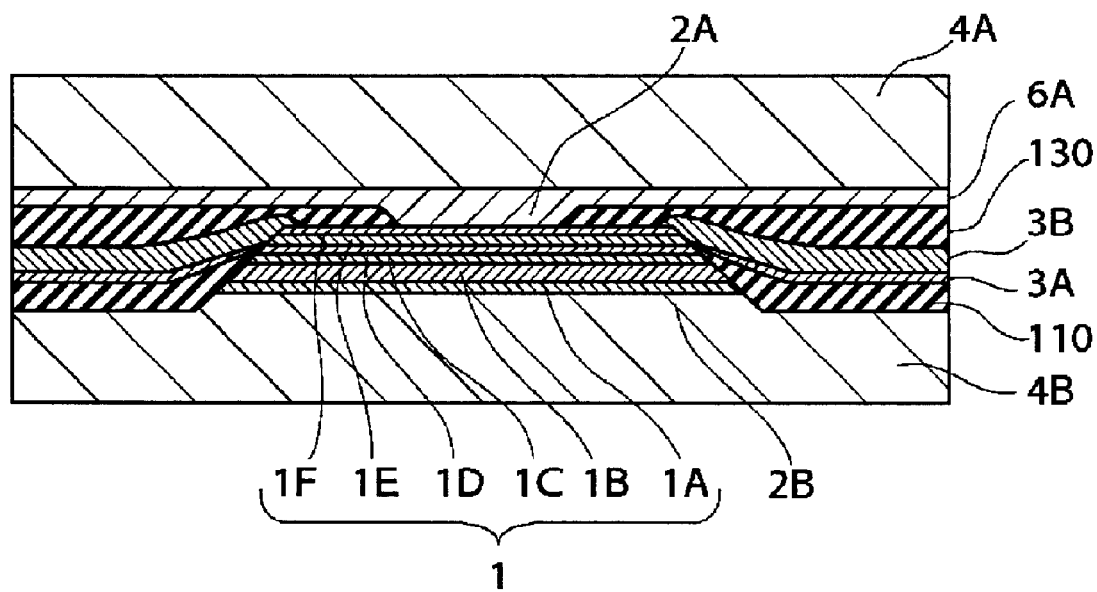
FIG. 17 is a cross-sectional view of the significant part of a magnetic head using a CPP type magnetoresistive effect element according to the second example of the invention.

FIG. 17 is a cross-sectional view of the significant part of a magnetic head using a CPP type magnetoresistive effect element according to the second example of the invention. Here again, the medium-facing surface is in this side of the plane of the drawing sheet.

In this example, a magnetic shield 4B is formed on a substrate, not shown, and the GMR film 1 is formed thereon. Configuration of the GMR film 1 maybe the same as that explained with reference to the first embodiment.

On the GMR film 1, the electrode 2A of Cu, current-carrying layer 6A of Cu, magnetic shield 4A of NiFe are formed. At opposite sides of the GMR film 1, the insulating film 110, bias-applying film base layer (Cr) 3A, bias-applying film (CoCrPt) 3B and insulating film ($Al_2O_3$) 130 are formed in this order.

Also in this example, the electrode 2A is narrower than the distance between the bias-applying films 3B, 3B, and the central part of the GMR film 1 having a high sensitivity is defined as the sensing area. Additionally in this example, by shaping the magnetic shield 4B to include an upward projection to use the projection as the electrode 2B, the steps of laminating a thin film for the electrode and the current-carrying layer can be omitted.

Furthermore, since the thin film for the current-carrying layer 6B and the electrode 2B need not be interposed, the additional effect of shortening the gap length can be obtained.

(Third Example)

Next explained is the third example of the invention.

Figure 18A:
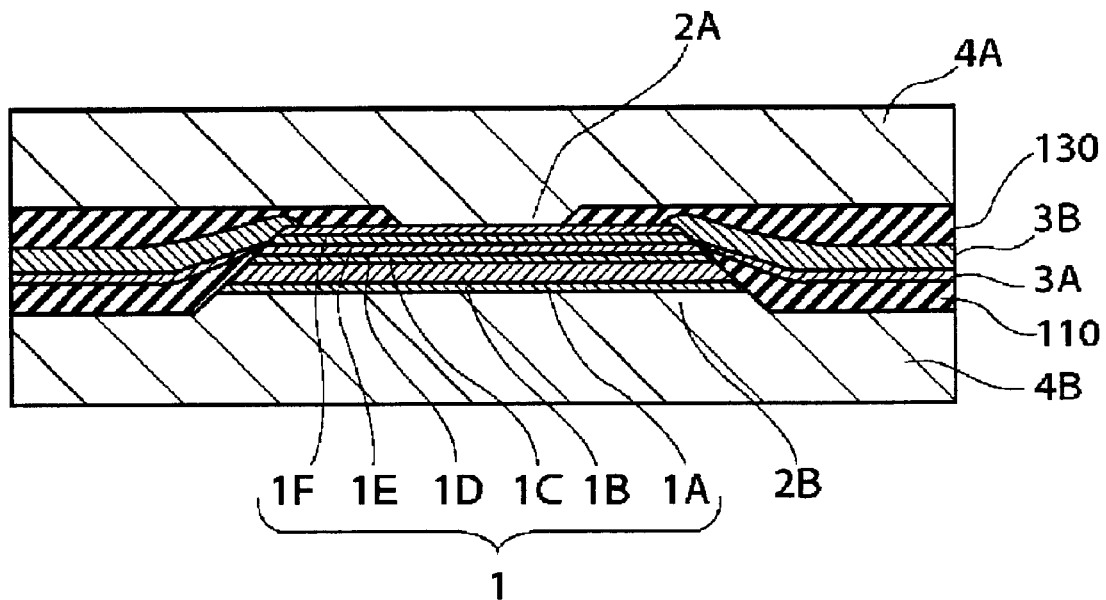
FIGS. 18A and 18B are cross-sectional views of the significant parts of magnetic head using CPP type magnetoresistive effect elements according to the third example of the invention.
Figure 18B:
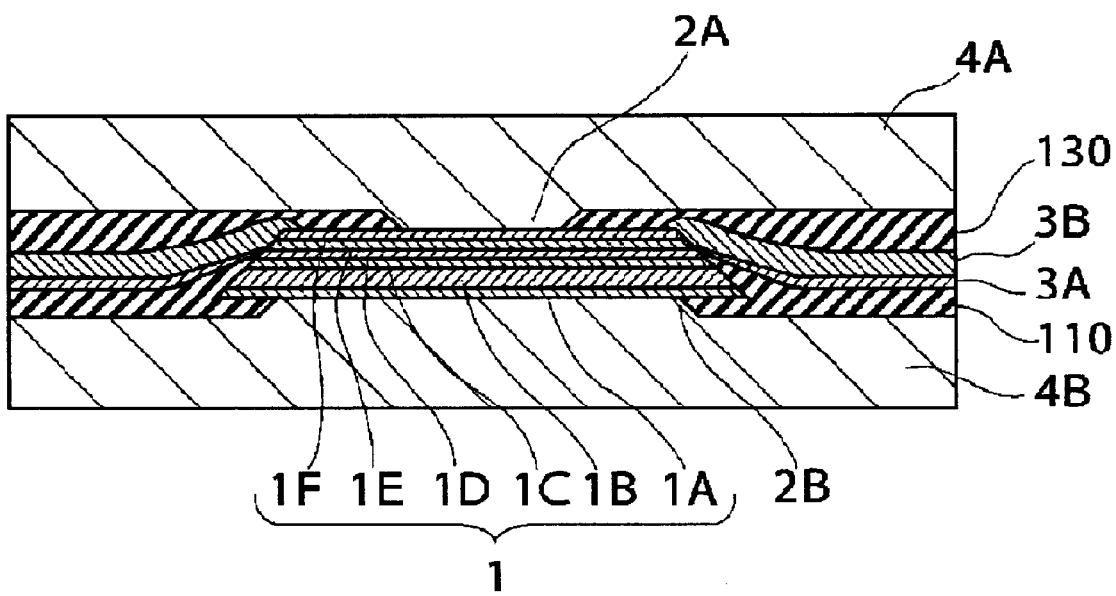

FIGS. 18A and 18B are cross-sectional views of the significant parts of magnetic head using CPP type magnetoresistive effect elements according to the third example of the invention. Here again, the medium-facing surface is in this side of the plane of the drawing sheet. As to FIGS. 18A and 18B, the same components as those explained with reference to FIGS. 16 and 17 are labeled with common reference numerals, and their detailed explanation is omitted.

In this example, not only the magnetic shield 4B but also the magnetic shield 4A is formed to include a projection, and the projection functions as the electrode 2A. In this manner, the step of laminating the thin film for the current-carrying layer 6A and the electrode 2A can be omitted.

In the structure of FIG. 18A, the width of the electrode 2B is approximately equal to the width of the GMR film 1. This structure is acceptable in case the horizontal extension of the sense current inside the GMR film 1 is not large.

In contrast, in the structure of FIG. 18B, the width of the electrode 2B is narrower than the width of the GMR film 1 and wider than the width of the electrode 2A. This structure can more reliably limit the extension of the sense current. Therefore, in case the horizontal extension of the sense current is large, the structure of FIG. 18B is advantageous.

Furthermore, since this example need not interpose any thin film layer for the current-carrying layer 6A and the electrodes 2A, 2B between the magnetic shields 4A, 4B, the effect of further shortening the gap length is obtained. From this point of view, by using the second or third example, depending on the gap length required, a magnetic head not using the flux guide can be made.

(Fourth Example)

Next explained is the substantial part of a manufacturing process of the magnetic head according to the first example as the fourth example of the invention.

FIGS. 19A through 21C are cross-sectional views of the magnetic head according to the first example of the invention under a manufacturing process of its significant part.

Figure 19A:
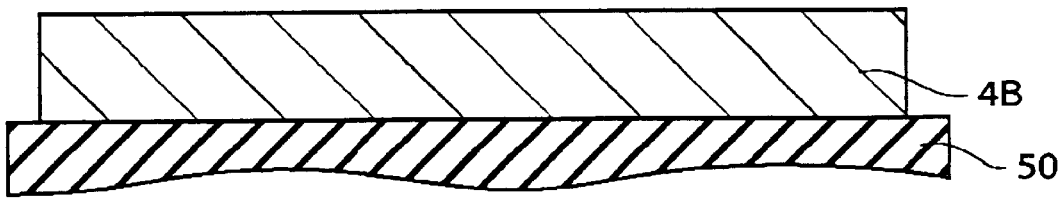
FIGS. 19A through 19D are cross-sectional views of the magnetic head according to the first example of the invention under a manufacturing process of its significant part.

First as shown in FIG. 19A, a magnetic shield 4B of NiFe is formed on a substrate 50 made of $Al_2O_3/Al_2O_3$-TiC.

Figure 19B:
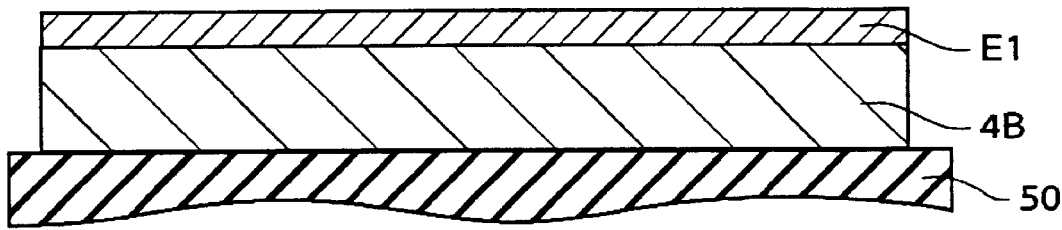

After that, as shown in FIG. 19B, the lead E1 of Cu is formed thereon. In these steps, the surface of the magnetic shield 4B and the surface of the lead E1 are smoothed by CMP, for example, if necessary.

Figure 19C:
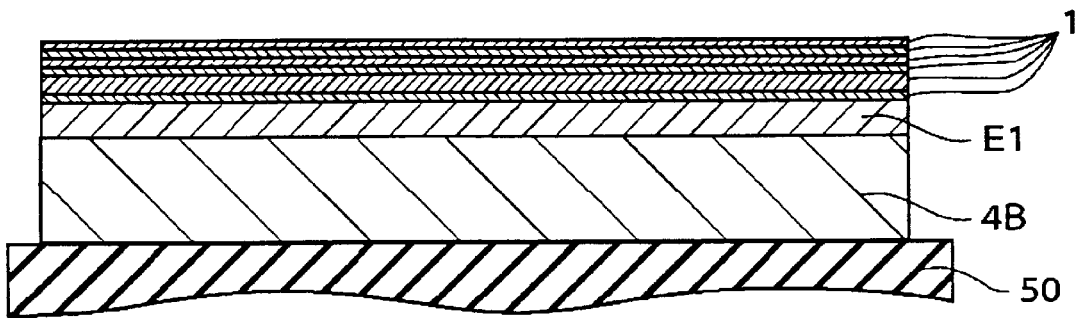

Next as shown in FIG. 19C, a GMR film 1 having a multi-layered structure laminating Ta/PtMn/CoFe/Ru/CoFe/Cu/CoFe/NiFe/Ta in this order is formed.

Figure 19D:
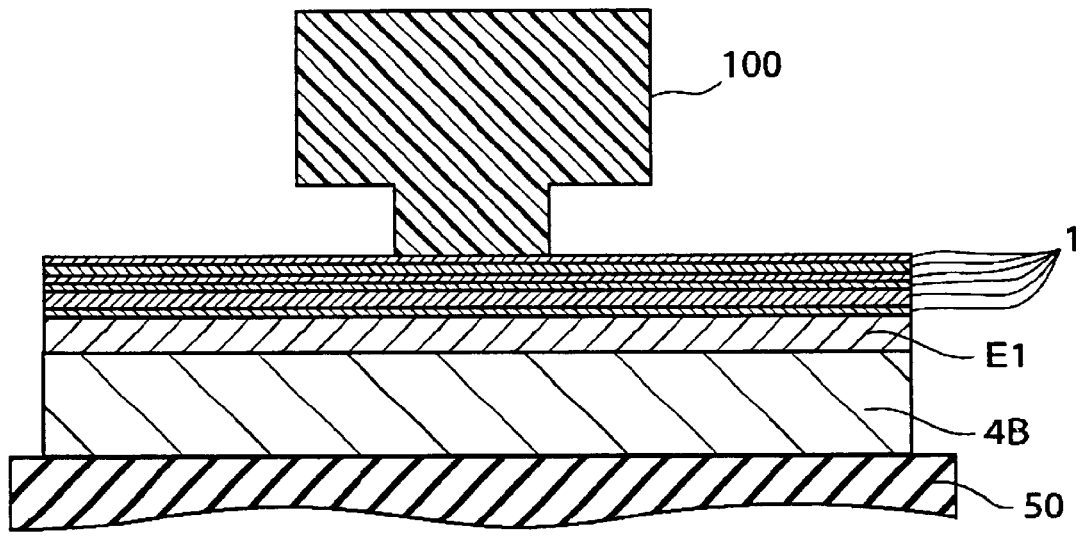

Then, as shown in FIG. 19D, a T-shaped resist mask 100 using two-layered resist is formed.

Figure 20A:
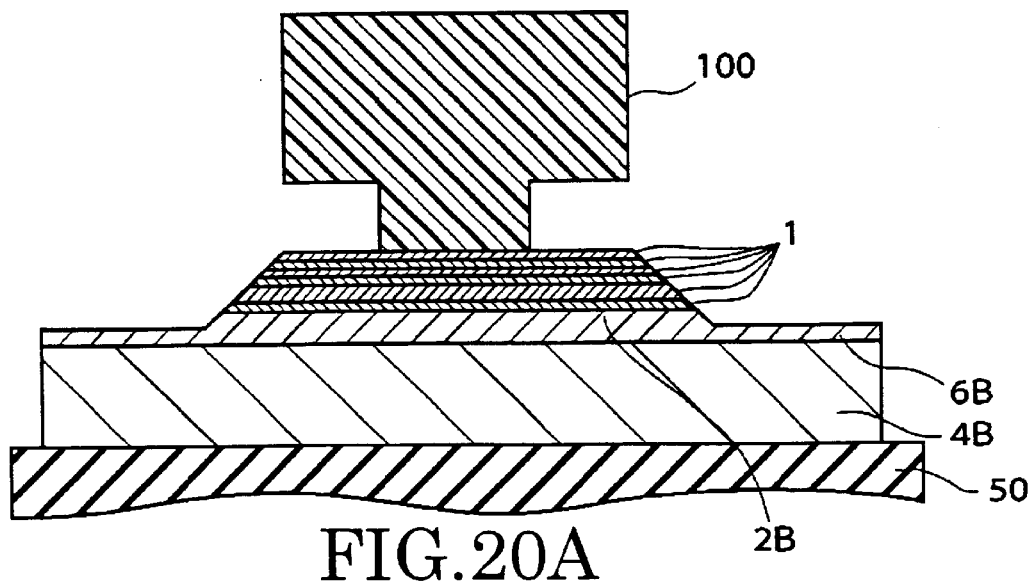
FIGS. 20A through 20C are cross-sectional views of the magnetic head according to the first example of the invention under the same manufacturing.

Next as shown in FIG. 20A, using the resist mask 100 as a mask, the GMR film 1 is patterned by ion milling to also remove a part of lead E1 by overmilling, thereby to form the pillar-shaped electrode 2B.

Figure 20B:
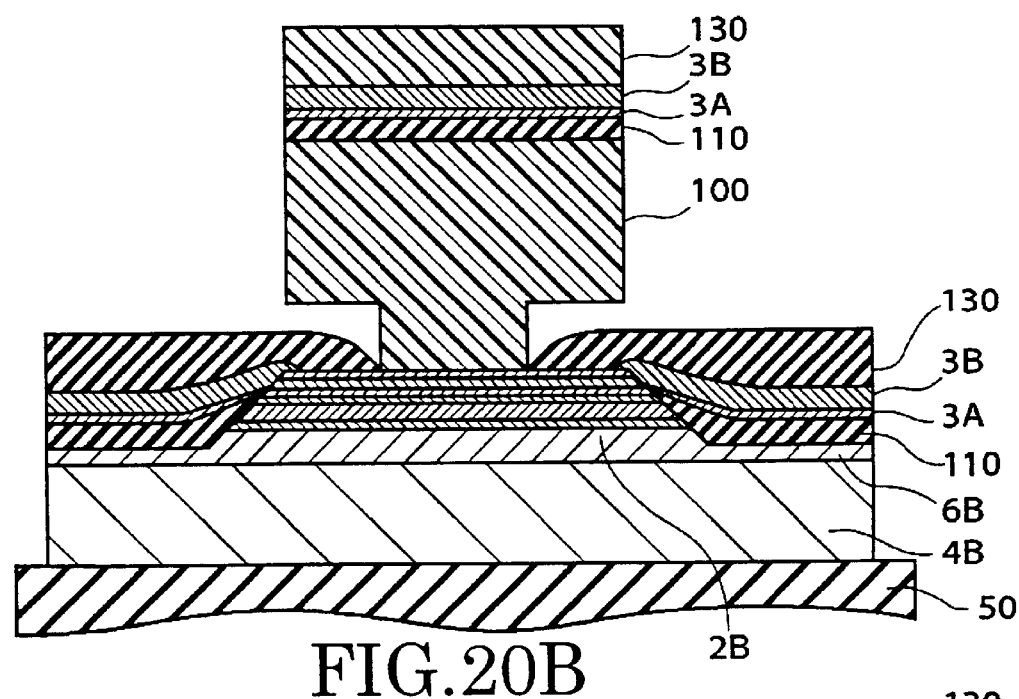

Next as shown in FIG. 20B, while maintaining the resist mask 100, an insulating film 110 of $Al_2O_3$, bias-applying film base layer 3A of Cr, bias-applying layer 3B of CoCrPt, and insulating film 130 of $Al_2O_3$ are formed in this order. Upon forming the insulating film 130, it is invited to extend to below the resist mask 100 as shown by increasing the sputtering pressure, for example.

Figure 20C:
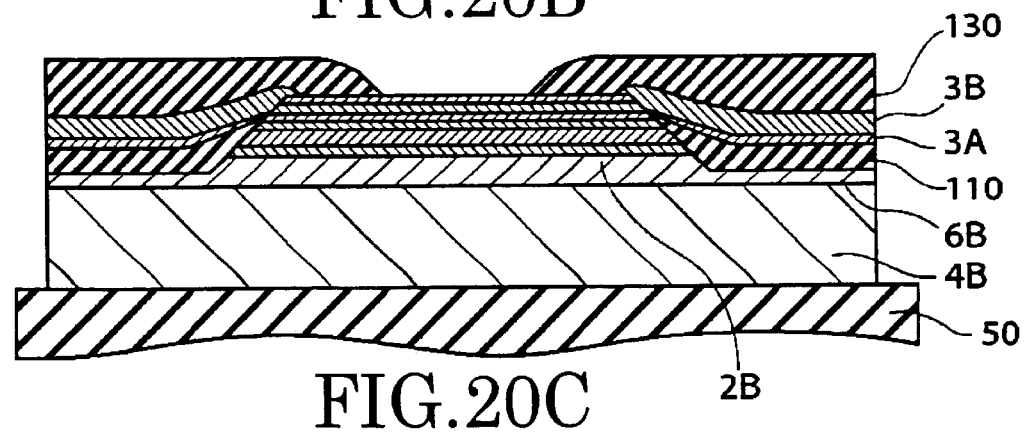

Next as shown in FIG. 20C, the film stacked on the resist mask 100 is removed together with the resist mask 100 by lift-off.

Figure 21A:
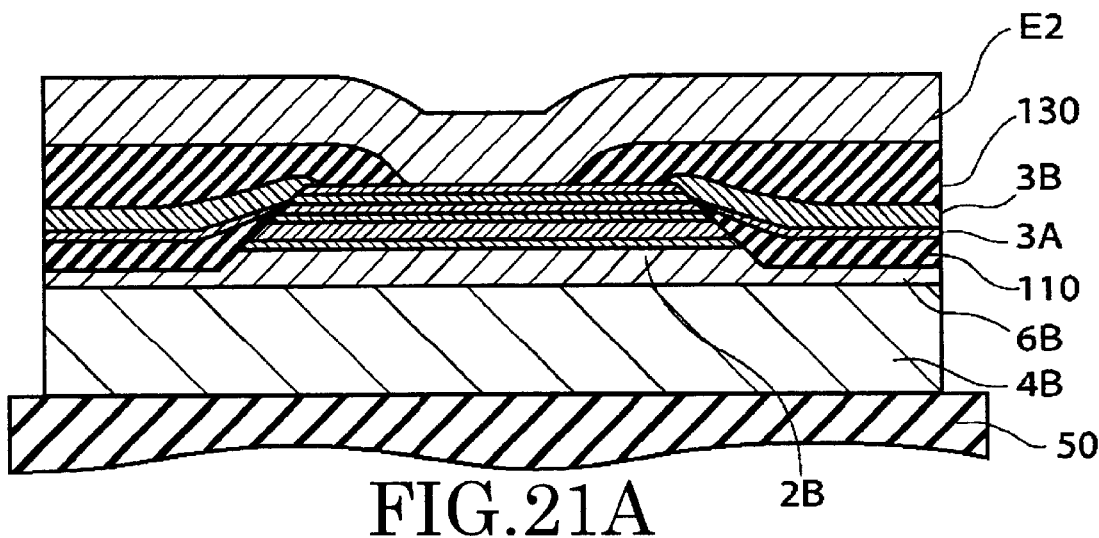
FIGS. 21A through 21C are cross-sectional views of the magnetic head according to the first example of the invention under the same manufacturing.

Next as shown in FIG. 21A, the lead E2 of Cu is formed to bury the recess in the insulating film 130.

Figure 21B:
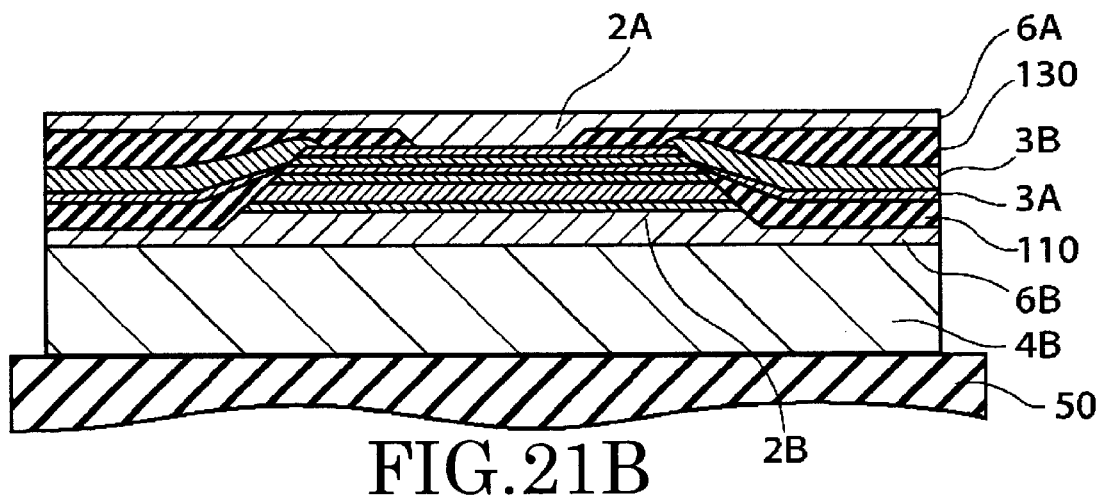

Next as shown in FIG. 21B, the surface of the lead E2 is smoothed, if necessary, by CMP or etch-back technique. As a result, the electrode 2A and the current-carrying layer 6A are formed.

Figure 21C:
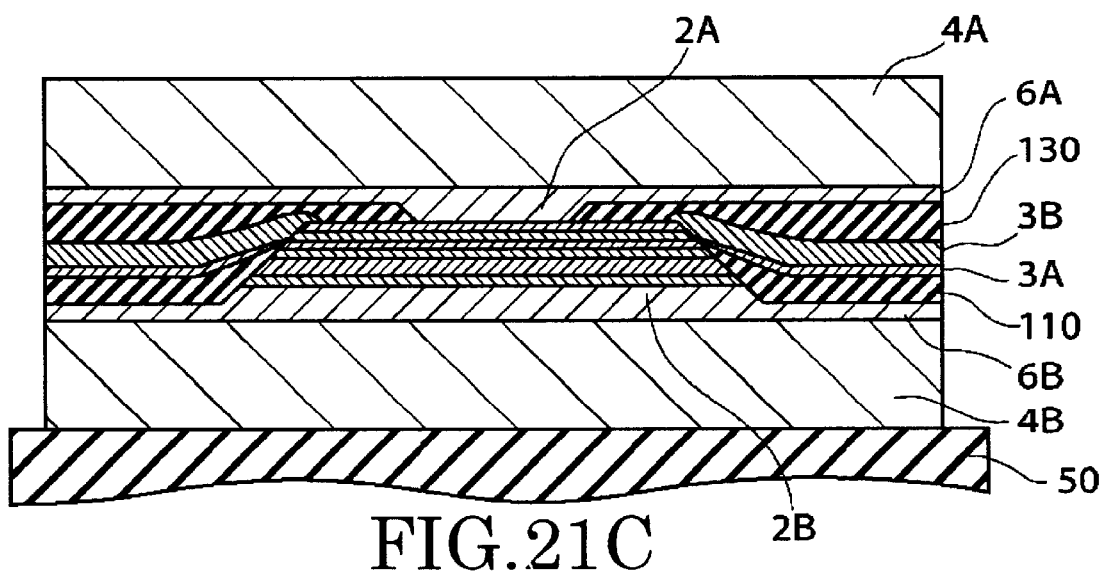

Then as shown in FIG. 21C, the magnetic shield 4A is formed to complete the substantial part of the reproducing magnetic head according to the first example.

(Fifth Example)

Next explained is the fifth example of the invention.

Figure 22:
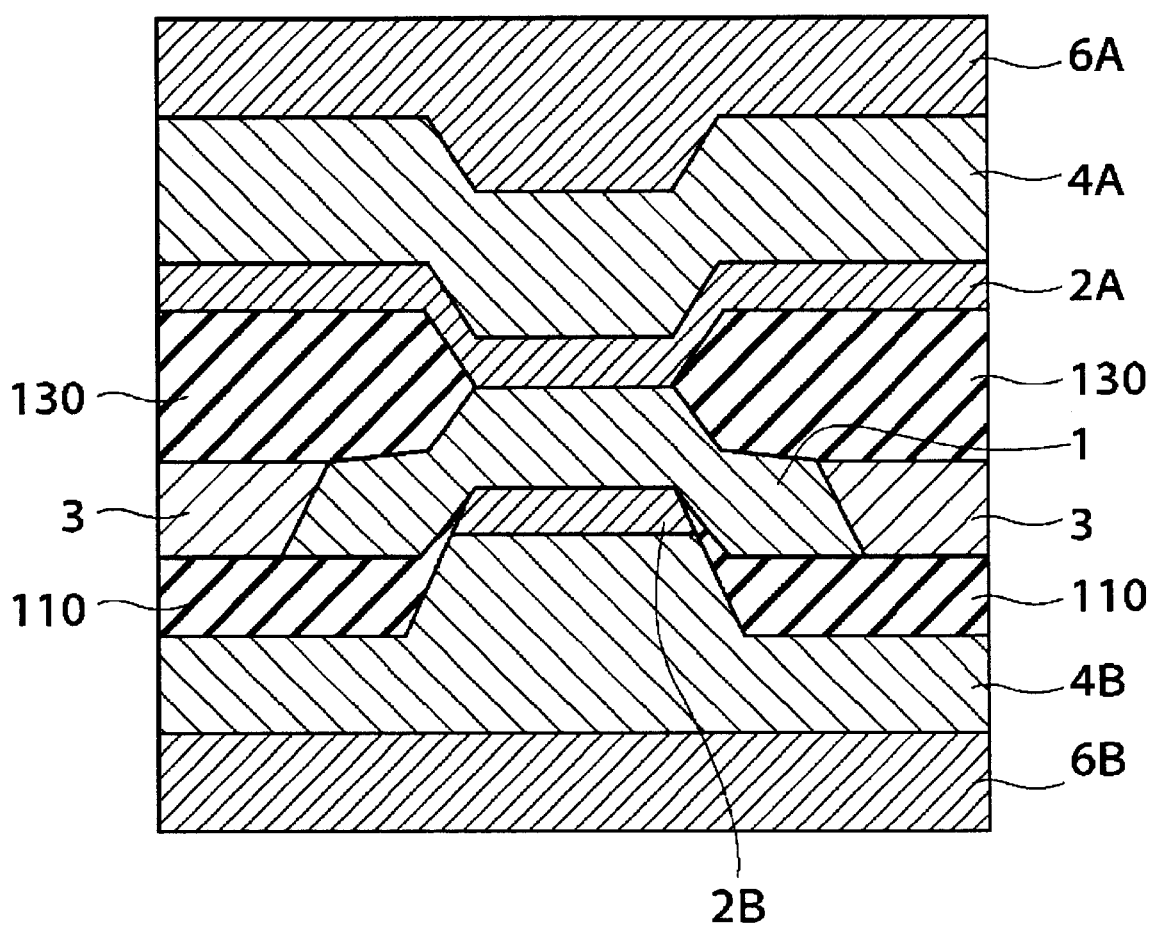
FIG. 22 is a cross-sectional view of the significant part of a magnetic head using a CPP type magnetoresistive effect element according to the fifth example of the invention.

FIG. 22 is a cross-sectional view of the significant part of a magnetic head using a CPP type magnetoresistive effect element according to the fifth example of the invention. Here again, the medium-facing surface is in this side of the plane of the drawing sheet.

Formed on and under the GMR film 1 are electrodes 2A, 2B having a thickness determining the magnetic gap and functioning to supply the sense current perpendicularly to the GMR film 1. The electrodes 2A, 2B may be made of a non-magnetic conductive material such as Ta.

A bias film 3 of CoPt is formed to lie on opposite sides of the GMR 1. The bias film 3 has the role of applying a bias magnetic field to the GMR film 1 to suppress the Barkhausen noise. In this example, the GMR film 1 is shaped to meander along a projecting portion defined by the magnetic shield 4B and the electrode 2B.

On and under these components, magnetic shields 4A, 4B of NiFe, for example, are formed to sandwich them. The magnetic shields 4A, 4B include protruding portions forming parts of pillars for carrying the sense current perpendicularly to the GMR film 1.

Outside the pillar portions, insulating films 110, 130 made of $Al_2O_3$ are formed on and under the GMR film 1 and the bias film 3 for the purpose of electrical insulation.

Also in this embodiment, widths of contact surfaces of the electrodes 2A, 2B with the GMR film 1 are narrower than the gap in the bias film 3.

In this embodiment, the upper and lower magnetic shields 4A, 4B have protruding portions. In order to increase the recording density, it is necessary to narrow the track width and elongate the gap length. In CPP type magnetoresistive effect elements, the width of the perpendicular current supply region, i.e. the contact width of electrodes 2A, 2B at the tops of pillars determines the track width, and the distance between the upper and lower shields determines the gap length. Therefore, simultaneously narrowing and thinning them leads to increasing the recording density.

However, for the benefit of the manufacturing process, the electrodes and the insulating film should be substantially equal in thickness. Therefore, simply thinning the electrodes forming the magnetic gap results in thinning the insulating film and decreasing the insulating performance, and this causes short-circuiting in a portion other than the pillars. This kind of short-circuiting mostly derives from electrostatic discharge, and the element will become extremely weak against static electricity.

In contrast, the example shown here, in which the magnetic shields have protruding portions to partly form the pillars, can form the insulating films 110, 130 thicker than the electrodes 2A, 2B determining the magnetic gap. Therefore, the magnetic head thus obtained simultaneously satisfies both the requirement of a narrower gap and the requirement of a good insulating performance.

On the other hand, for making such protruding portions of the upper and lower shields 4A, 4B, it is difficult to form them at accurate positions by using the typical photolithographic process. Here is rather required a process capable of forming the upper protruding portion in self-alignment with the lower protruding portion.

Explained below is a manufacturing method of the embodiment using such self-alignment technique.

FIGS. 23A through 23G are cross-sectional views of the magnetic head according to the present example of the invention under a manufacturing process of its significant part.

Figure 23A:
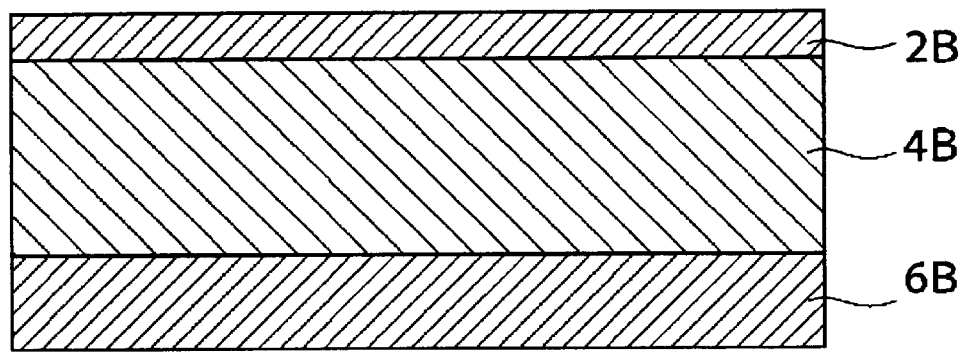
FIGS. 23A through 23G are cross-sectional views of the magnetic head according to the fifth example of the invention under a manufacturing process of its significant part.

First referring to FIG. 23A, a copper (Cu) layer to be used as the current-carrying layer 6B, a nickel-iron (NiFe) layer to be used as the shield layer 4B, and a tantalum (Ta) layer to be used as the electrode 2B are formed, and the surface of the electrode 2B is smoothed by CMP (chemical mechanical polishing).

Figure 23B:
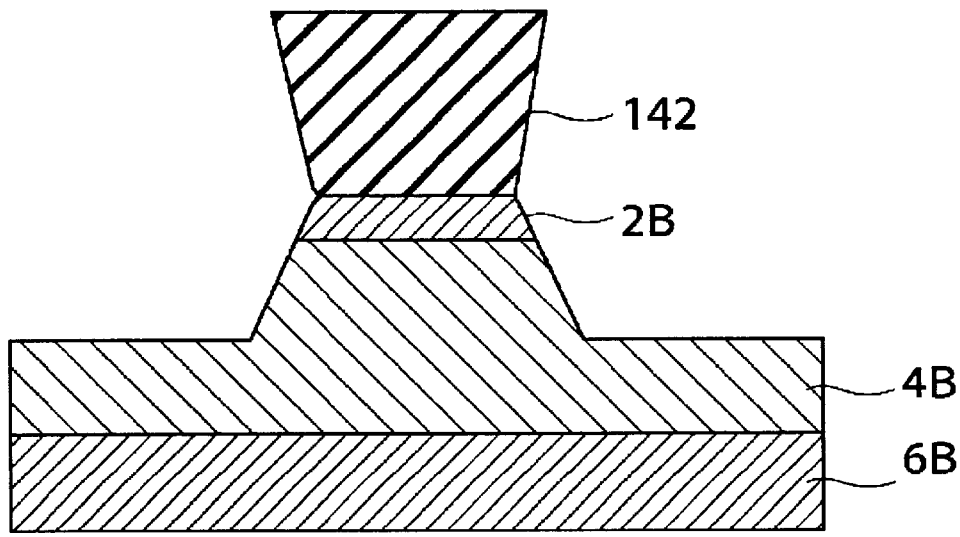

Next as shown in FIG. 23B, etching follows. More specifically, a resist mask 142 is formed by EB (electron beam) lithography, for example, and etching by ion milling is carried out to selectively remove the electrode 2B and an upper part of the shield 4B.

Figure 23C:
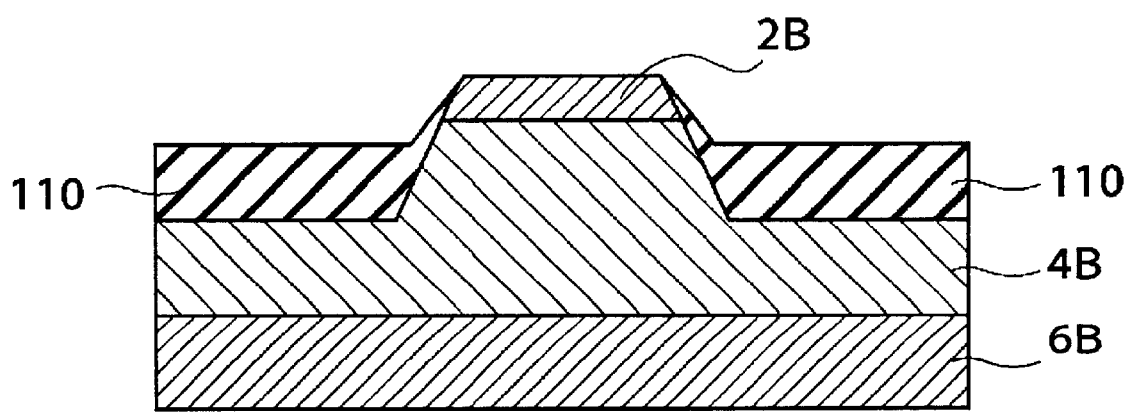

Next as shown in FIG. 23C, the insulating film 110 is formed. More specifically, while maintaining the resist mask 142, $Al_2O_3$ to be used as the insulating film is formed up to a thickness with which a level difference remains. Thereafter, the resist mask 142 is removed by lift-off.

Figure 23D:
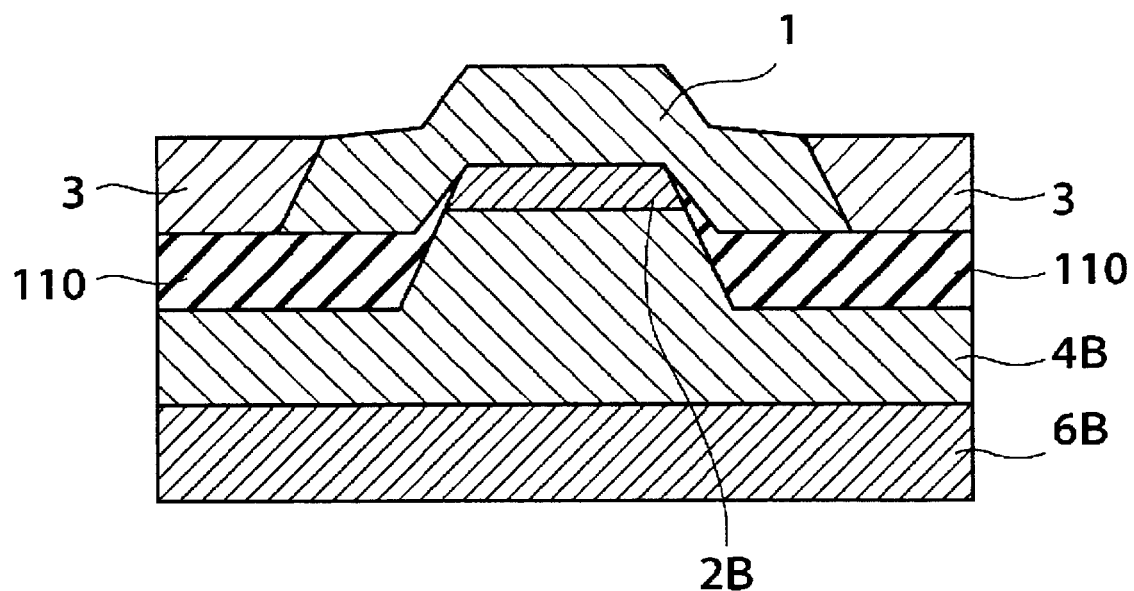

Next as shown in FIG. 23D, the GMR film 1 and the bias film 3 are formed. That is, the GMR film 1 is formed on the entire surface. Then, using a resist (not shown) as a mask, it is selectively removed by ion milling. Thereafter, CoPt to be used as the bias film 3 is deposited, and the resist is removed by lift-off.

Figure 23E:
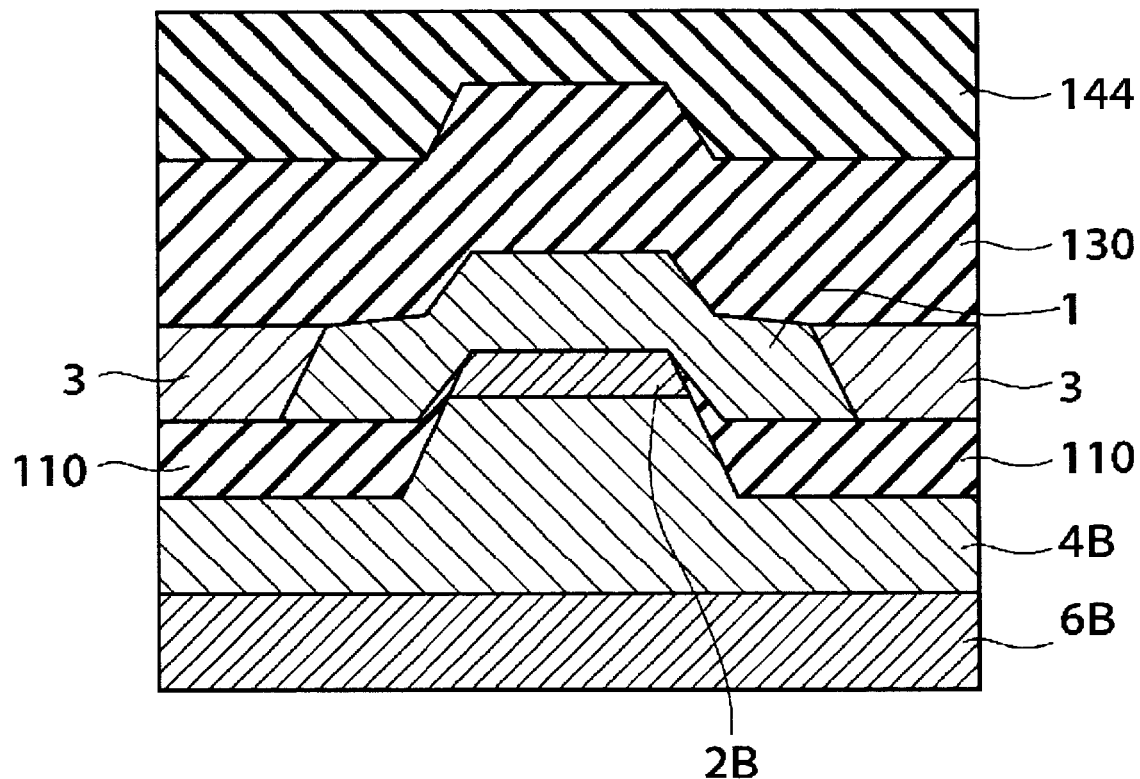

Next as shown in FIG. 23E, $Al_2O_3$ to be used as the insulating film 130 is stacked, and after coating a resist 144 thereon, the surface of the resist is smoothed. In this step, the insulating film 130 should reflect the protruding shape of the lower layer.

Figure 23F:
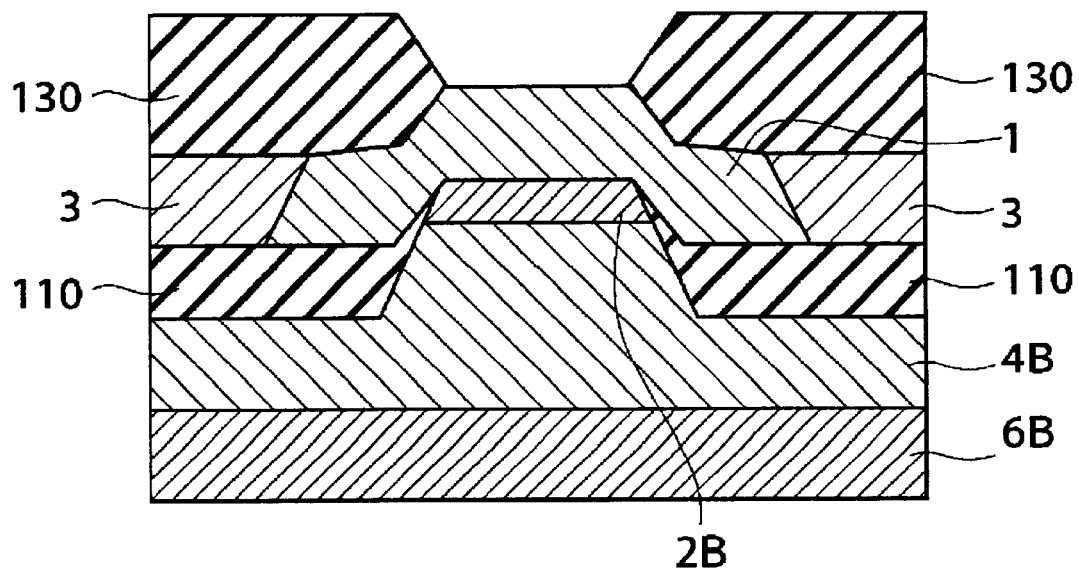

Next as shown in FIG. 23F, the insulating film 130 is selectively etched. More specifically, the resist 144 is etched back by RIE. When the etching-back progresses to expose the surface of the insulating film 130, the etching condition of RIE is changed to another that preferentially etches the insulating film 130 than the resist 144. Under the new condition, the insulating film 130 is etched using the remainder resist 144 as the mask. This manner of etching makes it possible form an opening in self-alignment with the protruding portion of the shield 4B in the insulating film 130.

Figure 23G:
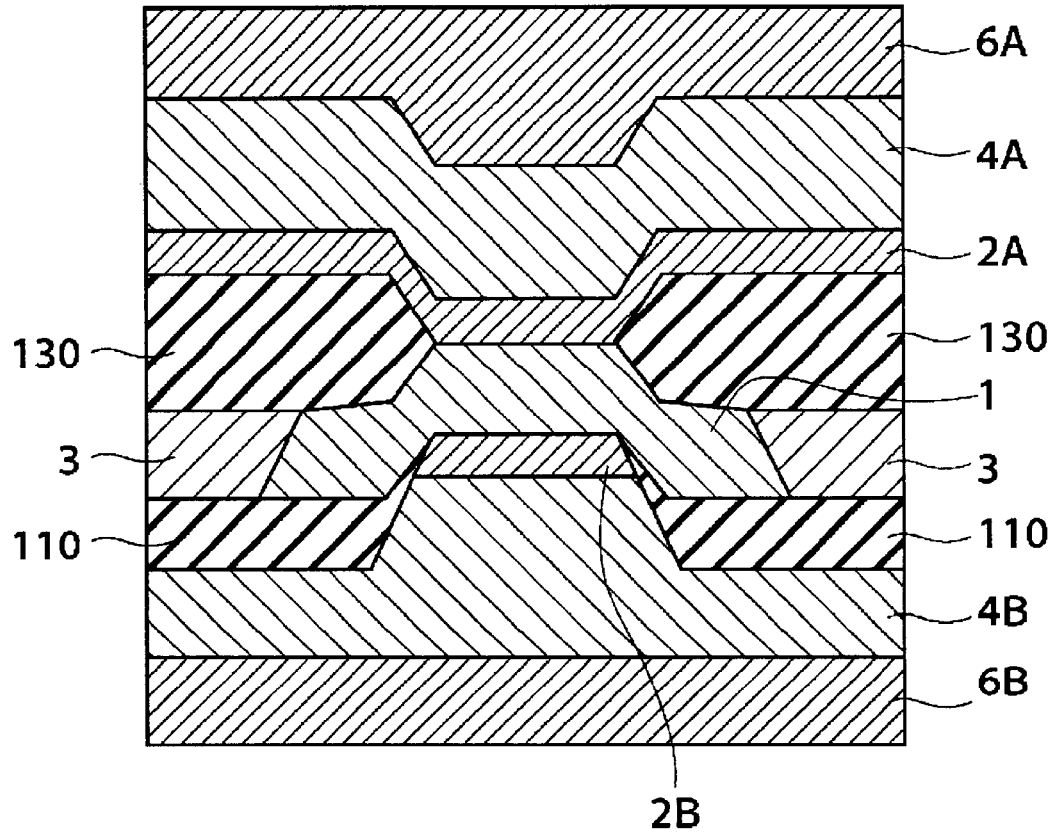

Next as shown in FIG. 23G, tantalum (Ta) to be used as the electrode 2A, nickel-iron (NiFe) to be used as the shield 4A, and copper (Cu) to be used as the current-carrying layer 6A are formed sequentially.

By using the method explained above, it is possible to form the protruding portions of the shields 4A, 4B in self-alignment.

In this example, the base layer (1A in FIGS. 16 through 18B) of the GMR layer 1 may be used as the electrode 2B. Similarly, the protective film (1F in FIGS. 16 through 18B) of the GMR 1 may be used as the electrode 2A.

(Sixth Example)

Next explained is a magnetic reproducing apparatus incorporating a magnetoresistive effect element according to the invention, taken as the sixth example of the invention.

Next explained is a magnetic recording apparatus according to the embodiment of the invention. The magnetic head using the magnetoresistive element according to the embodiments of the invention, as explained with reference to FIGS. 1 through 23G, can be incorporated in a magnetic head assembly of a recording/reproducing integral type, for example, and can be mounted in a magnetic recording apparatus.

Figure 24:
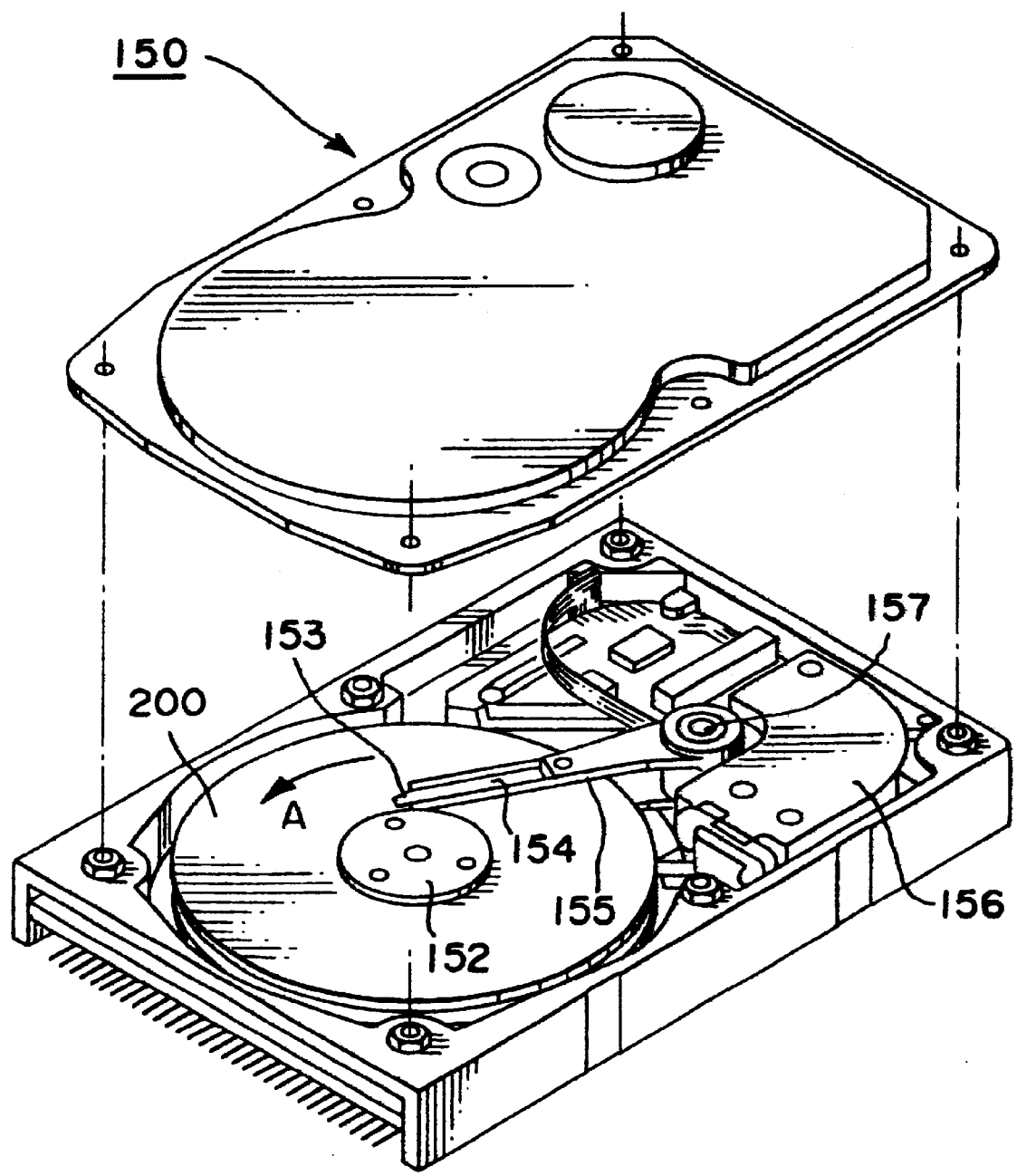
FIG. 24 is a perspective view that schematically shows a configuration of a major part of a magnetic recording/reproducing apparatus according to the embodiments of the invention.

FIG. 24 is a perspective view that schematically shows a configuration of a major part of a magnetic recording/reproducing apparatus according to the embodiment of the invention. The magnetic recording/reproducing apparatus 150 according to the embodiment is an apparatus of a type using a rotary actuator. In FIG. 24, a recording magnetic disk 200 is mounted on a spindle 152 and rotated in the arrow A direction by a motor, not shown, which is responsive to a control signal from a drive device controller, not shown. A head slider 153 executed recording or reproduction of information to be stored in the magnetic disk 200 is attached to the tip of a thin-film suspension 154. The head slider 153 includes the magnetic head according to the foregoing embodiment near its tip.

When the magnetic disk 200 rotates, the medium-facing surface (ABS) of the head slider 153 is held with a predetermined floating amount from the surface of the magnetic disk 200. Alternatively, the apparatus may employ a contact-type configuration where the slider 153 is in contact with the disk 200 during the operation.

The suspension 154 is connected to one end of an actuator arm 155 that has a bobbin portion for holding a drive coil, not shown. At the other end of the actuator arm 155, a voice coil motor 156, which is a kind of linear motor, is provided. The voice coil motor 156 is composed of a drive coil, not shown, wound up on the bobbin portion of the actuator arm 155, and a magnetic circuit made up of a permanent magnet and an opposed yoke disposed in confrontation so as to sandwich the drive coil.

The actuator arm 155 is held by ball bearings, not shown, which are provided upper and lower two positions of a rigid shaft 157 for free rotational and slidable movements with a driving force from the voice coil motor 156.

Figure 25:
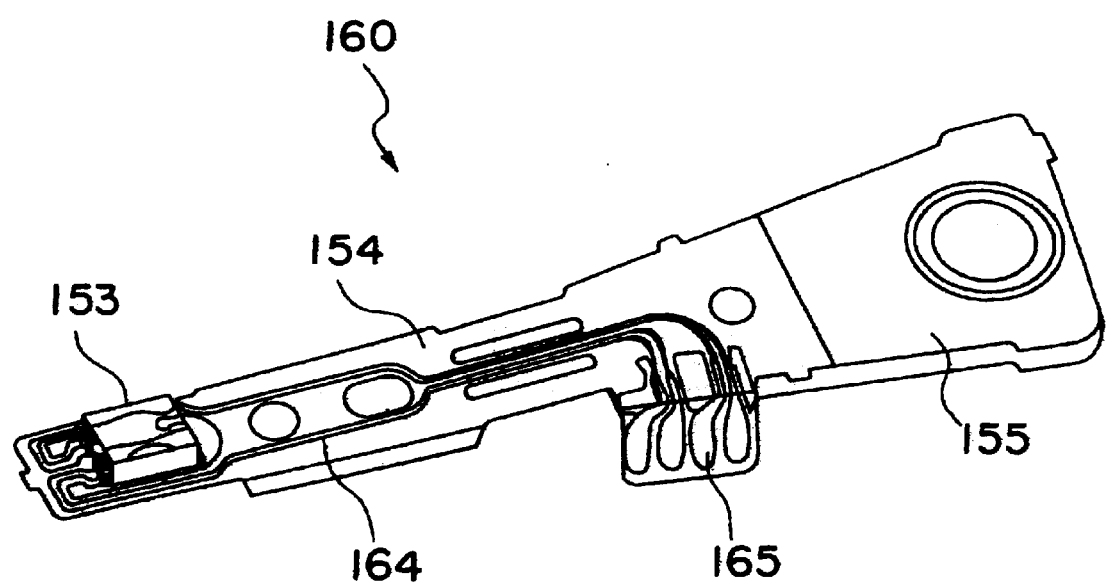
FIG. 25 is an enlarged, perspective view of the magnetic head assembly from the actuator arm 155 to its distal end, taken from the disk side.

FIG. 25 is an enlarged, perspective view of the magnetic head assembly from the actuator arm 155 to its distal end, taken from the disk side. The magnetic head assembly 160 includes the actuator arm 155 having the bobbin portion for holding the drive coil, for example, and the suspension 154 is connected to one end of the actuator arm 155.

At the extremity of the suspension 154, the head slider 153 incorporating the reproducing magnetic head already explained with reference to FIGS. 1 through 23G is attached. A recording head may be combined with it. The suspension 154 has a lead line 164 for writing and reading signals, and the lead line 164 and electrodes of the magnetic head incorporated in the head slider 153 are electrically connected. Numeral 165 denotes an electrode pad of the magnetic head assembly 160.

The magnetic recording apparatus according to the embodiments of the invention, as shown in FIGS. 24 and 25, can greatly improve the recording density as compared with conventional systems, and can simultaneously improve the stability and reliability of reproduced signals.

(Seventh Example)

Next explained is a magnetic memory incorporating a magnetoresistive effect element according to the embodiment of the invention, taken as the seventh example of the invention. That is, using any of magnetoresistive effect elements explained with reference to FIGS. 1 through 23G, a magnetic memory such as magnetic random access memory including memory cells in a matrix arrangement, for example, can be realized.

Figure 26:
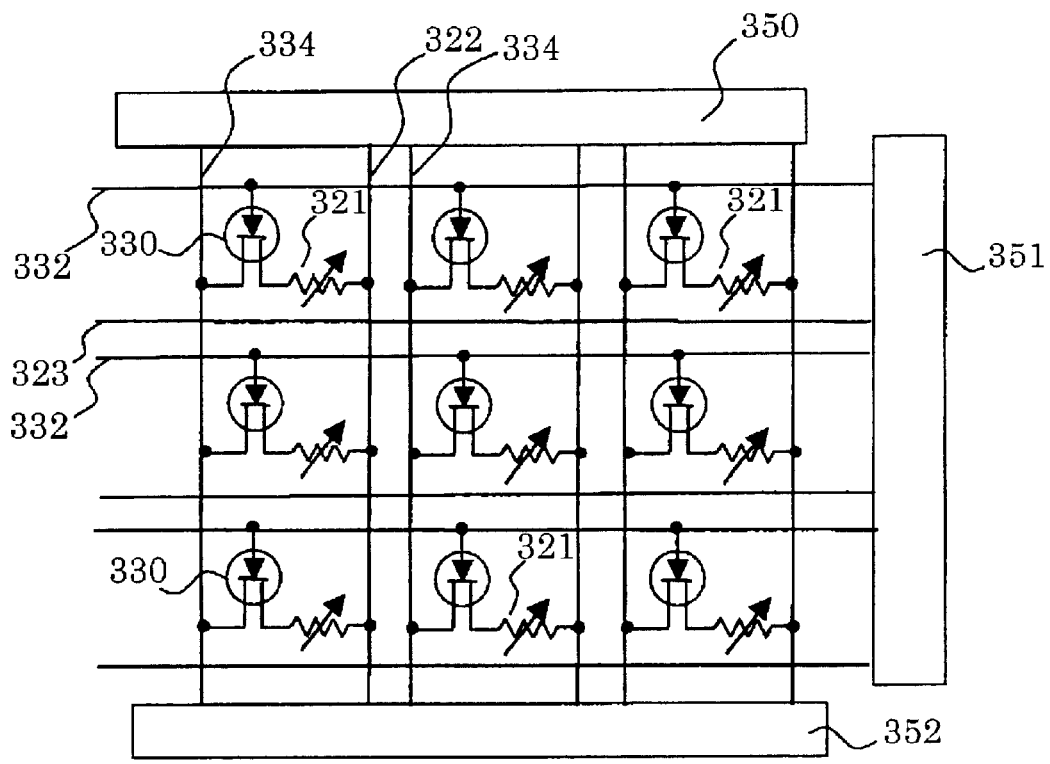
FIG. 26 is a diagram schematically showing a matrix configuration of a magnetic memory according to an example of the invention.

FIG. 26 is a diagram schematically showing a matrix configuration of a magnetic memory according to an example of the invention.

That is, FIG. 26 shows a circuit arrangement of an embodiment having arrayed memory cells. For selecting one bit in the array, a column decoder 350 and a row decoder 351 are provided. Activated one of bit lines 334 and activated one of word lines 3320 turn ON a switching transistor 330, and definitely select the corresponding memory cell. Then the sense amplifier 352 detects and reads out bit information recorded in the magnetic recording layer forming the magnetoresistive effect element 321.

Writing of bit information is performed by a magnetic field generated by a write current supplied to a specific writing word line 323 and a specific bit line 322.

Figure 27:
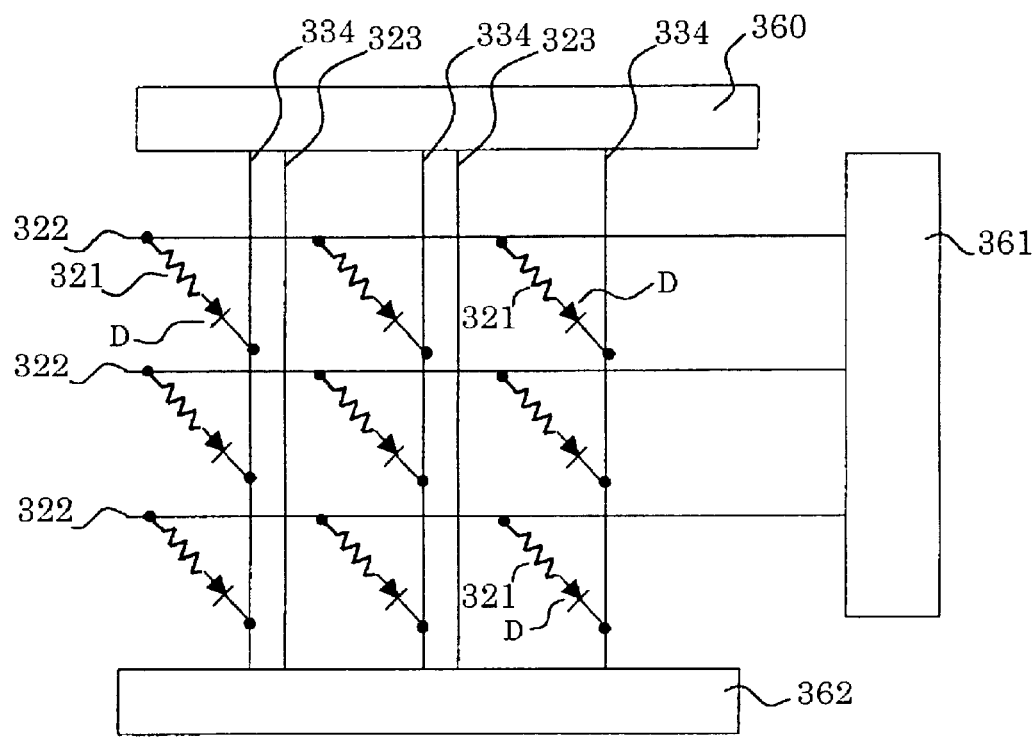
FIG. 27 is a diagram schematically showing a matrix configuration of a magnetic memory according to another example of the invention.

FIG. 27 is a diagram schematically showing a matrix configuration of a magnetic memory according to another example of the invention. In this specific example, one of bit lines 322 and one of word lines 334 are selected from those connected in a matrix arrangement by decoders 360, 361, respectively, and a specific memory cell is selected from the array. Each memory cell has a structure including a magnetoresistive effect element 321 and a diode D in serial connection. The diode D has the role of preventing the sense current from biasing in each of the memory cells other than that including the selected magnetoresistive effect element 321.

Writing is effected by a magnetic field generated by a writing current supplied to a specific bit line 322 and a specific writing word line 323.

Figure 28A:
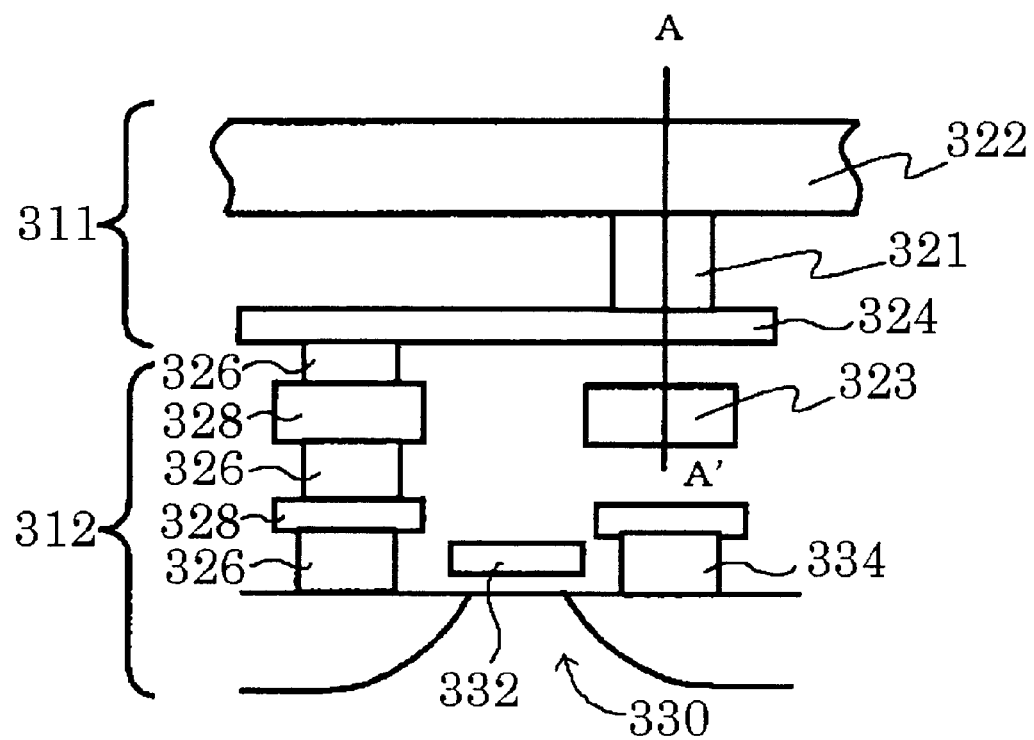
FIG. 28A is a diagram schematically showing a cross-sectional structure of the significant part of a magnetic memory according to an embodiment of the invention.
Figure 28B:
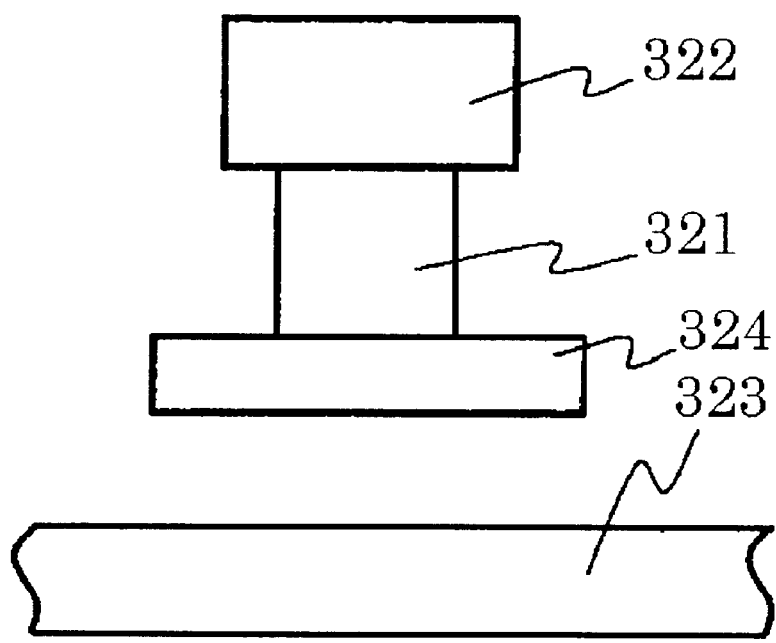
FIG. 28B is a cross-sectional view taken along the A–A' line of FIG. 28A.

FIG. 28A is a diagram schematically showing a cross-sectional structure of the significant part of a magnetic memory according to an embodiment of the invention. FIG. 28B is a cross-sectional view taken along the A–A' line of FIG. 28A.

The structure shown here corresponds to one memory cell contained in the magnetic memory shown in FIG. 26. That is, it is a memory cell for a single bit in a magnetic memory operable as random access memory. This memory cell includes a recording element portion 311 and an address-selecting transistor portion 312.

The recording element portion 311 includes a magnetoresistive effect element 321 and a pair of wirings 322, 324 connected thereto. The magnetoresistive effect element 321 is one of magnetoresistive effect elements already explained with reference to FIGS. 1 through 23G, and any having a GMR effect or TMR effect is acceptable.

For reading bit information from a magnetoresistive effect element having a GMR effect, a sense current may be supplied to the magnetoresistive effect element 321, thereby to detect a change in resistance thereof.

Especially when the magnetoresistive effect element includes a ferromagnetic double tunneling junction of a multi-layered structure laminating a magnetic layer, non-magnetic tunneling layer, magnetic layer, non-magnetic tunneling layer and magnetic layer, it is advantageous because changes in resistance by a tunneling magnetic resistance (TMR) effect ensures a high magneto resistance effect.

In these structures, one of magnetic layers may serve as a magnetically pinned layer, and another magnetic layer may serve as a magnetic recording layer.

On the other hand, in the selecting transistor portion 312, a transistor 330 connected through a via 326 and a buried wiring 328 is provided. The transistor 330 switches in response to a voltage applied to the gate 332 to open or close the current path between the magnetoresistive effect element 321 and the wiring 334.

Below the magnetoresistive effect element 321, a writing wiring 323 extends to intersect with the wiring 322. These writing wirings 322, 323 may be made of, for example, aluminum (Al), copper (Cu), tungsten (W), tantalum (Ta) or an alloy containing any of them. For writing bit information in the magnetoresistive effect element 321 in the memory cell having the above-explained configuration, magnetization of the recording layer of the magnetoresistive effect element is adequately reversed by supplying pulse current to the wirings 322, 323 and applying a composite magnetic field induced by the currents.

Reading of bit information is effected by supplying a sense current through the wiring 322, magnetoresistive effect element 321 including the magnetic recording layer, and lower electrode 324, and by measuring the resistance value or a change of the resistance value of the magnetoresistive effect element 321.

The magnetic memory according to the present example, which uses magnetoresistive effect elements explained with reference to FIGS. 1 through 23G, ensures reliable writing and reliable reading by reliably controlling the magnetic domain of the recording layer even when the cell size is miniaturized.

Heretofore, some embodiments of the invention have been explained in conduction with some specific examples.

The invention, however, is not limited to these examples. Regarding the structure of the magnetoresistive effect film 1, shapes and materials of the electrodes, magnetic shields, current-carrying layers, insulating films, and so forth, any person skilled in the art will be able to borrow appropriate ones from known techniques to practically use the embodiments of the present invention and obtain substantially the same effects.

It will be also appreciated that the invention is applicable not only to magnetic heads or magnetic reproducing apparatuses of the lengthwise recording type but also to those of the perpendicular magnetic recording type and ensures substantially the same effects.

The magnetic reproducing apparatus according to the embodiments of the invention may be of a so-called stationary type incorporating a particular recording medium in a stationary fashion, or of a so-called "removable" type permitting recording mediums to be loaded and unloaded.

Furthermore, the invention also contemplates, in its scope, all magnetoresistive effect elements, magnetic heads and magnetic recording and reproducing apparatuses that any artisan will be able to bring into practical use on the basis of, or by appropriately modifying, the magnetoresistive effect elements, magnetic heads and magnetic recording apparatuses that have been explained herein as embodiment of the invention.

As explained above, according to the embodiments of the invention, a high sensitivity can be realized in a CPP type magnetoresistive effect element even under a high recording density by supplying the sense current exclusively to the inner portion having a high sensitivity, avoiding portions near the bias-applying films where the sensitivity is lowered by the intensive bias magnetic field.

Especially when the size of the contact surface between the electrode and the magnetoresistive effect film is limited smaller than 0.3 micron, the embodiments of the invention can accomplish an ultra-high density while alleviating degradation of the efficiency.

Furthermore, the embodiments of the invention absorbs a positional error between the upper and lower electrodes by making the electrodes in different sizes. As a result, the embodimtns of the invention provides a magnetoresistive effect element effectively minimizing variance in output due to a positional error between the electrodes.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetoresistive effect element comprising:
    a magnetoresistive effect film having first and second main surfaces opposed to each other;
    a first electrode having a first contact surface in contact with the first main surface of the magnetoresistive effect film by a first width;
    a second electrode having a second contact surface in contact with the second main surface of the magnetoresistive effect film so as to be opposed to the first electrode;
    a pair of bias-applying films spaced apart by a distance wider than the first width of the first contact surface in the direction of the first width to apply a bias magnetic field in a direction substantially in parallel to the film main surfaces of the magnetoresistive effect film; and
    said magnetoresistive effect film including a magnetically free layer, a magnetically pinned layer, and an electrically conductive non-magnetic intermediate layer interposed between the magnetically free layer and the magnetically pinned layer.

2. The magnetoresistive effect element according to claim 1, wherein a relation of W1<W2 is satisfied where W1 is the first width and W2 is a width of the second contact surface in a direction of the first width.

3. The magnetoresistive effect element according to claim 1, wherein the first width is not larger than 0.3 micron.

4. The magnetoresistive effect element according to claim 1, wherein a high-resistance layer is interposed between the first or second electrode and the magnetoresistive effect film, the high-resistance layer being made of a material having a higher specific resistance than the first and second electrodes.

5. The magnetoresistive effect element according to claim 1, wherein a lengthwise direction of one of the first and second contact surfaces is twisted by approximately 90 degrees from a lengthwise direction of other of the first and second contact surfaces.

6. The magnetoresistive effect element according to claim 1, further comprising a pair of magnetic shields disposed to sandwich the magnetoresistive effect film.

7. The magnetoresistive effect element according to claim 6, wherein one of the magnetic shields is integrally formed with the electrode.

8. The magnetoresistive effect element according to claim 6, wherein a current-carrying layer of a material having a lower specific resistance than one of the shields is provided between the magnetic shield and the magnetoresistive effect film, the current-carrying layer and one of the first and second electrodes being electrically connected.

9. The magnetoresistive effect element according to claim 6, wherein the pair of magnetic shields have their own protruding portions that are protruding toward the magnetoresistive effect film and are aligned with each other,
    the first and second electrodes being located between top surfaces of respective the protruding portions and the magnetoresistive effect element, and
    the magnetoresistive effect film being formed to meander in accordance with the contour of one of the protruding portions.

10. The magnetoresistive effect element according to claim 2, further comprising a substrate which supports the magnetoresistive effect film, the first and second electrodes, and the bias-applying films, the first electrode being disposed nearer to the substrate than the second electrode.

11. A manufacturing method of a magnetoresistive effect element comprising:
    forming a first layer of an electrically conductive material on a substrate;
    forming a first protruding portion by selectively etching the first layer;
    forming a magnetoresistive effect film on the first layer such that a surface thereof defines a second protruding portion reflecting the contour of the first protruding portion;
    forming a bias-applying film at both ends of the magnetoresistive effect film;
    forming an insulating film on the magnetoresistive effect element and the bias-applying films such that a surface thereof defines a third protruding portion reflecting the contour of the second protruding portion;

forming a mask layer on the insulating film to bury the third protruding portion and thereby form a flat surface;

etching the mask layer until exposing the third protruding portion, and etching the insulating layer under a condition for preferentially etching the insulating layer than the mask layer, thereby to form an opening in the insulating layer for access to the second protruding portion; and burying the opening with a second layer of an electrically conductive material; and said step of forming said magnetoresistive effect film including forming a film including magnetically free layer, a magnetically pinned layer, and an electrically conductive non-magnetic intermediate layer interposed between the magnetically free layer and the magnetically pinned layer.

12. The manufacturing method of a magnetoresistive effect element according to claim 11, wherein the width of the first protruding portion in a spacing direction of the bias-applying films is narrower than the distance between the bias-applying films.

13. The manufacturing method of a magnetoresistive effect element according to claim 11, wherein the width of the second protruding portion in a spacing direction of the bias-applying films is narrower than the distance between the bias-applying films.

14. The manufacturing method of a magnetoresistive effect element according to claim 11, wherein the first layer has a first shield layer and a first electrode layer, and the second layer has a second electrode layer and a second shield layer.

15. The manufacturing method of a magnetoresistive effect element according to claim 11, wherein an insulating layer is formed on the first layer before the magnetoresistive effect film is formed.

16. A magnetic head comprising a magnetoresistive effect element, the magnetoresistive effect element including:

a magnetoresistive effect film having first and second main surfaces opposed to each other;

a first electrode having a first contact surface in contact with the first main surface of the magnetoresistive effect film by a first width;

a second electrode having a second contact surface in contact with the second main surface of the magnetoresistive effect film so as to be opposed to the first electrode; and a pair of bias-applying films spaced apart by a distance wider than the first width of the first contact surface in the direction of the first width to apply a bias magnetic field in a direction substantially in parallel to the film main surfaces of the magnetoresistive effect film; and said magnetoresistive effect film including a magnetically free layer, a magnetically pinned layer, and an electrically conductive non-magnetic intermediate layer interposed between the magnetically free layer and the magnetically pinned layer.

17. The magnetic head according to claim 16, further including first and second wirings connected to the first and second electrodes, respectively, the first and second wirings being formed to extend substantially in parallel to a medium-facing surface in an area where a magnetic field induced by a current flowing in the wirings substantially affects the magnetoresistive effect film, and the first and second wiring extending substantially in parallel with each other.

18. A magnetic reproducing apparatus comprising a magnetic head for reproducing information magnetically recorded on a magnetic recording medium, the magnetic head including:

a magnetoresistive effect film having first and second main surfaces opposed to each other;

a first electrode having a first contact surface in contact with the first main surface of the magnetoresistive effect film by a first width;

a second electrode having a second contact surface in contact with the second main surface of the magnetoresistive effect film so as to be opposed to the first electrode;

a pair of bias-applying films spaced apart by a distance wider than the first width of the first contact surface in the direction of the first width to apply a bias magnetic field in a direction substantially in parallel to the film main surfaces of the magnetoresistive effect film; and said magnetoresistive effect film includeing a magnetically free layer, a magnetically pinned layer, and an electrically conductive non-magnetic intermediate layer interposed between the magnetically free layer and the magnetically pinned layer.

19. A magnetic memory comprising a plurality of magnetoresistive effect elements, each the magnetoresistive effect element including:

a magnetoresistive effect film having first and second main surfaces opposed to each other;

a first electrode having a first contact surface in contact with the first main surface of the magnetoresistive effect film by a first width;

a second electrode having a second contact surface in contact with the second main surface of the magnetoresistive effect film so as to be opposed to the first electrode;

a pair of bias-applying films spaced apart by a distance wider than the first width of the first contact surface in the direction of the first width to apply a bias magnetic field in a direction substantially in parallel to the film main surfaces of the magnetoresistive effect film; and said magnetoresistive effect film including a magnetically free layer, a magnetically pinned layer, and an electrically conductive non-magnetic intermediate layer interposed between the magnetically free layer and the magnetically pinned layer.

* * * * *

UNITED STATES PATENT AND TRADEMARK OFFICE
CERTIFICATE OF CORRECTION

PATENT NO. : 6,757,143 B2
DATED : June 29, 2004
INVENTOR(S) : Funayama et al.

Page 1 of 1

It is certified that error appears in the above-identified patent and that said Letters Patent is hereby corrected as shown below:

<u>Title page,</u>
Item [12], the first inventor's last name is incorrect. It should read:

-- [12] United States Patent
Funayama et al. --
Item [75], the first inventor's last name is incorrect. It should read:

-- [75] Inventors: Tomomi Funayama, Kanagawa-ken (JP); Masayuki Takagishi, Kanagawa-ken (JP); Kohichi Tateyama, Kanagawa-ken (JP); Yuichi Ohsawa, Kanagawa-ken (JP); Susumu Hashimoto, Kanagawa-ken (JP); Michiko Hara, Kanagawa-ken (JP); Akio Hori, Kanagawa-ken (JP) --

Signed and Sealed this

Seventh Day of September, 2004

JON W. DUDAS
*Director of the United States Patent and Trademark Office*